United States Patent [19]
Mizutani et al.

[11] Patent Number: 6,004,618
[45] Date of Patent: *Dec. 21, 1999

[54] METHOD AND APPARATUS FOR FABRICATING ELECTROLUMINESCENT DEVICE

[75] Inventors: Atsushi Mizutani, Anjo; Masayuki Katayama, Handa; Nobuei Ito, Chiryu; Tadashi Hattori, Okazaki, all of Japan

[73] Assignee: Nippondenso., Ltd., Kariya, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/841,334

[22] Filed: Apr. 30, 1997

Related U.S. Application Data

[63] Continuation of application No. 08/428,824, Apr. 25, 1995, abandoned.

[30] Foreign Application Priority Data

Apr. 26, 1994 [JP] Japan ................................. 6-088923
Feb. 16, 1995 [JP] Japan ................................. 7-028448

[51] Int. Cl.[6] .......................... B05D 5/12; C23C 16/00
[52] U.S. Cl. ........................... 427/66; 427/69; 427/109; 427/124; 427/252; 427/255.15; 427/255.28
[58] Field of Search ............................. 427/66, 69, 109, 427/124, 126.3, 126.4, 248.1, 253.2, 255.3, 255.15, 255.23, 252

[56] References Cited

U.S. PATENT DOCUMENTS

| | | | |
|---|---|---|---|
| 5,112,650 | 5/1992 | Winter et al. | 427/255.2 |
| 5,309,070 | 5/1994 | Sun et al. | |
| 5,385,751 | 1/1995 | Riaz et al. | 427/255.2 |
| 5,453,494 | 9/1995 | Kirlin et al. | 427/255.3 |
| 5,834,053 | 11/1998 | Dye et al. | 427/66 |

FOREIGN PATENT DOCUMENTS

| | | |
|---|---|---|
| 62-98596 | 5/1987 | Japan . |
| 1163995 | 6/1989 | Japan . |
| 2-152191 | 6/1990 | Japan . |
| 2-239187 | 9/1990 | Japan . |
| 3-4482 | 1/1991 | Japan . |
| 3-77639 | 12/1991 | Japan . |
| 377639 | 12/1991 | Japan . |
| 565478 | 3/1993 | Japan . |
| 6-20775 | 1/1994 | Japan . |

OTHER PUBLICATIONS

Barrow, et al: "A New Class of Blue TFEL Phosphors with Application to VGA Full–Color Display", SID no month available 93 Digest, pp. 761–764.

Soininen, et al: "Blue electroluminescence of SrS:Ce, SoCl$_4$ thin films frown by Atomic Layer Epitaxy", Euro Display no month available '93, Conference Proceedings, The 13th International Display Research Conf.SID Society:pp. 511–514.

*Primary Examiner*—Brian K. Talbot
*Attorney, Agent, or Firm*—Pillsbury Madison & Sutro, LLP

[57] ABSTRACT

Fabrication of an electroluminescent device having a high-quality luminescent layer is disclosed. The device emits intense blue light. A first electrode layer, a first dielectric layer, the luminescent layer, a second dielectric layer, and a second electrode layer are successively formed on a glass substrate. At least the exit side of the device is made from an optically transparent material. A first gaseous source material of a group II element belonging to group II of the periodic table, a second gaseous source material of a group VIB element belonging to group VIB, and a third gaseous source material of an element forming the luminescent center of the luminescent layer are supplied into a reaction furnace through first, second, and third gas supply tubes, respectively, and caused to react with each other. Thus, the luminescent layer is formed by chemical vapor deposition. The first material acts as a base material from which the luminescent layer is formed. The first tube for the first material is laid in the center of the furnace. The third tube for the third material forming the luminescent center is laid around the first gas supply tube. The second tube is laid around the third tube.

31 Claims, 23 Drawing Sheets

METHOD AND APPARATUS FOR FABRICATING ELECTROLUMINESCENT DEVICE

This is a continuation of application Ser. No. 08/428,824, filed on Apr. 25, 1995, which was abandoned upon the filing hereof.

CROSS REFERENCE TO RELATED APPLICATION

This application is based upon and claims the benefit of priority of the prior Japanese Patent applications No. 6-88923 filed on Apr. 26, 1994 and No. 7-28448 filed on Feb. 16, 1995, the contents of which are incorporated herein by reference.

BACKGROUND OF THE INVENTION

1. Field of the Invention

The present invention relates to a method and machine for fabricating electroluminescent devices which can be used to provide emissive segments or emissive matrix displays or which can be used as display devices in various intelligent terminals.

2. Related Arts

As is well known in the art, an electroluminescent device makes use of the fact that when an electric field is applied to a phosphor as consisting of zinc sulfide (ZnS), the phosphor emits light. Electroluminescent devices of this kind have attracted attention as devices forming an emissive flat-panel display.

The cross-sectional structure of a typical conventional electroluminescent device is shown in FIG. 33, where the device is generally indicated by numeral 10. This electroluminescent device 10 is fabricated by successively forming a first electrode layer 2, a first dielectric layer 3, a luminescent layer 4, a second dielectric layer 5, and a second electrode layer 6 on an insulating glass substrate 1. The first electrode layer 2 is made of a film of ITO (indium tin oxide) which is optically transparent. The first and second dielectric layers 3 and 5, respectively, are made of tantalum pentoxide ($Ta_2O_5$) or other similar material. The second electrode layer 6 is made of a film of ITO. These films of ITO are conductive films of indium oxide ($In_2O_3$) doped with tin (Sn). Since these ITO films have low resistivities, they have enjoyed wide acceptance as transparent electrode layers.

The color emitted by the luminescent layer 4 is determined by the kind of the dopant incorporated in the zinc sulfide (ZnS). For example, where terbium (Tb) is used as the luminescent center, the luminescent layer emits yellowish-green color. Where samarium (Sm) is added, reddish-orange color is produced. Where thulium (Tm) is added, blue color is emitted.

Some researchers are discussing the possibility that zinc sulfide (ZnS) doped with thulium (Tm) and strontium sulfide (SrS) doped with cerium (Ce) are adopted as the materials of the luminescent layer 4 emitting blue light, the layer 4 being contained in the electroluminescent device 10 of the structure described above.

Where the above-described zinc sulfide (ZnS) doped with thulium (Tm) is used in the luminescent layer 10, the emission brightness is so low that a practically sufficient brightness is not obtained. Where the strontium sulfide (SrS) doped with cerium (Ce) is employed, the emission brightness is relatively high but the emitted light is blue-green. Therefore, in order to obtain blue light, it is necessary to use a filter which cuts off light having wavelengths of, for example 500 nm or more. If such a filter is exploited, the resulting emission brightness is only about ten percent of the original emission brightness. For these reasons, it is difficult to use this structure as a blue light-emitting device providing practically sufficiently intense brightness. In consequence, a high-quality luminescent layer of strontium sulfide (SrS) doped with cerium (Ce) is needed to obtain a practically sufficient brightness.

In "Digest of Technical Papers on 1993 Display Information Society International Meeting, pp. 761–764", use of strontium thiogallate ($SrGa_2S_4$), barium thiogallate ($BaGa_2S_4$), and calcium thiogallate ($CaGa_2S_4$) as host materials of a luminescent layer is being discussed. Adoption of a luminescent layer consisting of such a host material to which cerium (Ce) is added as the luminescent center is being discussed. Use of this kind of luminescent layer can shift the emission spectrum toward shorter wavelengths. For example, even where green component is cut off by the use of a filter, the loss of the emission brightness caused by this filter can be reduced greatly.

However, as described in the aforementioned paper and in Japanese Patent Laid-Open No. 65478/1993, the luminescent layer is formed by sputtering during the fabrication. During this sputtering process, a thermal treatment is required to be performed at a high temperature exceeding 650° C. after the formation of the luminescent layer in order to crystallize the host material of the luminescent layer.

As a result, the following difficulties occur.

First, at such a high temperature, a strain is produced in the glass substrate. Furthermore, limitations are imposed on materials from which electrodes are fabricated.

Even if the thermal treatment is short, the crystallization of the host material of the luminescent layer does not progress sufficiently provided that the thermal treatment temperature lies within the temperature range in which neither the glass substrate nor the electrodes are adversely affected. The result is that a luminescent layer of high crystallinity cannot be obtained. This makes it impossible to realize high-brightness emission of blue light.

Moreover, since the film consists of ternary compounds, the composition of the film tends to deviate from the desired composition during thermal treatment. This deviation detrimentally affects the emission brightness.

Known methods for forming high-quality luminescent layers for electroluminescent displays include metal organic chemical vapor deposition (MOCVD) and atomic layer epitaxy (ALE). Where luminescent layers are formed based on the above-described zinc sulfide (ZnS) by these methods, electroluminescent devices of high emission brightness can be obtained. Strontium sulfide (SrS) doped with cerium (Ce) and grown by ALE is known as one material of the aforementioned luminescent layer emitting blue light.

However, the ALE has an intrinsic disadvantage that the growth rate is slow. Therefore, it takes a very long time to form a luminescent layer. Consequently, it is generally desired to form a luminescent layer by the MOCVD which enables a high growth rate.

However, if an alkaline earth sulfide such as strontium sulfide (SrS) doped with cerium (Ce) is grown by MOCVD, gaseous source materials react with each other in gas phase within a reaction furnace, producing particles and subsidiary products. As a result, it is impossible to derive a high-quality luminescent layer.

In the case of a ternary-compound luminescent layer such as calcium thiogallate ($CaGa_2S_4$), the problems are complicated further. For this reason, it has been considered that it is impossible to form a ternary-compound luminescent layer such as calcium thiogallate ($CaGa_2S_4$) by MOCVD.

SUMMARY OF THE INVENTION

In view of the foregoing circumstances, the present invention has been made. It is an object of the invention to provide a method of fabricating an electroluminescent device in such a way that the included high-quality luminescent layer emits intense blue light, whether the luminescent layer is binary or ternary.

It is another object of the invention to provide a machine which is adapted to fabricate an electroluminescent device having such a high-quality luminescent layer by chemical vapor deposition.

In a first feature of the invention, a method of fabricating an electroluminescent device having a luminescent layer over an insulating substrate comprises the steps of: preparing a group II element belonging to group II of the periodic table as a first gaseous source material; preparing a group VIB element belonging to group VIB of the periodic table as a second gaseous source material, both the group II and VIB elements acting as host material of the luminescent layer; preparing a luminescent center element as a third gaseous source material; supplying the first gaseous source material into a central region in a reaction furnace; supplying the second gaseous source material into a marginal region surrounding the central region inside the reaction furnace; supplying the third gaseous source material into the reaction furnace; and causing the gaseous source materials to react with each other inside the reaction furnace so that the luminescent layer is formed on the insulating substrate by chemical vapor deposition.

A second feature of the invention is based on the first feature described above and characterized in that, during supply of the first and second gaseous source materials into the reaction furnace, the flow velocity of the first gaseous source material inside the reaction furnace is made greater than the flow velocity of the second gaseous source material inside the reaction furnace.

A third feature of the invention is based on the first or second feature described above and characterized in that the third gaseous source material is introduced into the reaction furnace after being mixed with the first gaseous source material.

A fourth feature of the invention is based on any one of the first through third features and characterized in that the first gaseous source material is an organic compound of the group II element, and that the third gaseous source material is an organic compound of the luminescent center element.

A fifth feature of the invention is based on any one of first through fourth features and characterized in that the insulating substrate is a glass substrate, and that the substrate is heated to 300–600° C. during formation of the luminescent layer.

A sixth feature of the invention is based on any one of first through fifth features and characterized in that a gaseous halogen or halide is supplied into the reaction furnace either independent of the first and second gaseous source materials or after being mixed with the second gaseous source material.

A seventh feature of the invention lies in a method of fabricating an electroluminescent device having a luminescent layer over an insulating substrate, the method comprising the steps of: preparing a group II element as a first gaseous source material; preparing a group IIIB element as a second gaseous source material; preparing a group VIB element as a third gaseous source material; preparing an luminescent center element as a fourth gaseous source material; supplying these gaseous source materials into a reaction furnace and causing them to react with each other inside the reaction furnace so that the luminescent layer of II-IIIB-VIB compound is formed by chemical vapor deposition including the element forming the fourth gaseous source material as the luminescent center element.

An eighth feature of the invention is based on the seventh feature and characterized in that: (A) the first gaseous source material is supplied into a central region in the reaction furnace; (B) the second gaseous source material is supplied into a first region located outside the central region inside the reaction furnace; and (C) the third gaseous source material is supplied into an outer region located outside the first region inside the reaction furnace.

A ninth feature of the invention is based on the eighth feature and characterized in that the fourth gaseous source material is a trivalent element and introduced into the reaction furnace after being mixed with the second gaseous source material.

A tenth feature of the invention is based on the eighth feature and characterized in that the fourth gaseous source material is a bivalent element and introduced into the reaction furnace after being mixed with the first gaseous source material.

An eleventh feature of the invention is based on the seventh feature described above and characterized in that the first and second gaseous source materials are supplied into the central region in the reaction furnace, and that the third gaseous source material is supplied into a marginal region surrounding the central region inside the reaction furnace.

A twelfth feature of the invention is based on the eighth or eleventh feature described above and characterized in that the fourth gaseous source material is mixed with that of the first and second gaseous source materials which has a vaporization temperature closer to the vaporization temperature of the fourth gaseous source material and then introduced into the reaction furnace.

A thirteenth feature of the invention is based on any one of the seventh through twelfth features and characterized in that during supply of the various gaseous source materials into the reaction furnace, at least the flow velocity of the first gaseous source material inside the reaction furnace is made greater than that of the third gaseous source material inside the reaction furnace.

A fourteenth feature of the invention is based on any one of the seventh through thirteenth features and characterized in that: (A) the first gaseous source material is an organic compound of the group II element; (B) the third gaseous source material is an organic compound of the group IIIB element; and (C) the fourth gaseous source material is an organic compound of the luminescent center element.

A fifteenth feature of the invention is based on any one of the seventh through fourteenth features and characterized in that the insulating substrate is a glass substrate, and that the substrate is heated to 300–600° C. during formation of the luminescent layer.

A sixteenth feature of the invention is based on any one of the seventh through fifteenth features and characterized in that, during formation of the luminescent layer, the pressure inside the reaction furnace is controlled to be 20–90 torr.

A seventeenth feature of the invention is based on any one of the seventh through sixteenth features and characterized in that a gaseous halogen or halide is supplied into the reaction furnace either independent of the first, second, and third gaseous source materials or after being mixed with the third gaseous source material.

An eighteenth feature of the invention lies in a machine for fabricating an electroluminescent device by successively forming a first electrode layer, a first dielectric layer, a luminescent layer, a second dielectric layer, and a second electrode layer on an insulating substrate, the luminescent layer being formed by chemical vapor deposition, the electroluminescent device having a light takeout portion made of an optically transparent material, the machine comprising: a reaction furnace; a susceptor mounted inside the reaction furnace and acting to hold the insulating substrate on which the first electrode layer and the first dielectric layer have been formed; a first gas supply tube for supplying a first gaseous source material of a group II element belonging to group II of the periodic table; a second gas supply tube for supplying a second gaseous source material of a group VIB element belonging to group VIB of the periodic table into the reaction furnace; a third gas supply tube for supplying a third gaseous source material of a luminescent center element into the reaction furnace; and an exhaust port for discharging these supplied gases from the reaction furnace, wherein a gas blowout port of the first gas supply tube is arranged in a central region in the reaction furnace so as to open onto the surface of the substrate held by the susceptor and the second gas supply tube is laid around the first gas supply tube.

A nineteenth feature of the invention is based on the eighteenth feature of the invention and characterized in that there is further provided a fourth gas supply tube for supplying a fourth gaseous source material of a group IIIB element belonging to group IIIB of the periodic table into the reaction furnace, and that the second gas supply tube is laid around the fourth gas supply tube.

A twentieth feature of the invention is based on the eighteenth feature of the invention and characterized in that there is further provided a fourth gas supply tube for supplying a fourth gaseous source material of a group IIIB element belonging to group IIIB of the periodic table into the reaction furnace, the fourth gas supply tube being laid around the first gas supply tube, and that the second gas supply tube is laid around the fourth gas supply tube.

A twenty-first feature of the invention is based on the nineteenth or twentieth feature of the invention and characterized in that the fourth gas supply tube is also used as the third gas supply tube for supplying the gaseous source material forming the luminescent center if the luminescent center element is a trivalent element.

A twenty-second feature of the invention is based on any one of the eighteenth through twentieth feature of the invention and characterized in that the first gas supply tube is also used as the third gas supply tube for supplying the gaseous source material forming the luminescent center if the luminescent center element is a bivalent element.

A twenty-third feature of the invention is based on the nineteenth or twentieth feature of the invention and characterized in that, (A) if the vaporization temperature of the source material of the luminescent center element is close to the vaporization temperature of the first source material of the group II element, the third gas supply tube for supplying the gaseous source material of the luminescent center element is used also as the first gas supply tube, or (B) if the vaporization temperature of the source material of the luminescent center element is close to the vaporization temperature of the fourth source material of the group IIIB element, the third gas supply tube for supplying the gaseous source material of the luminescent center element is used as the fourth gas supply tube.

A twenty-fourth feature of the invention is based on any one of the eighteenth through twenty-third features of the invention and characterized in that the gas blowout port of the first gas supply tube is so arranged to be closer to the surface of the substrate than any other gas blowout ports of other gas supply tubes.

A twenty-fifth feature of the invention is based on any one of the eighteenth through twenty-fourth features of the invention and characterized in that there is further provided a fifth gas supply tube for supplying a source material containing a halogen element into the reaction furnace.

A twenty-sixth feature of the invention is based on any one of the eighteenth through twenty-fifth features of the invention and characterized in that the exhaust port is located behind the substrate held by the susceptor.

In the first feature described above, the first gaseous source material of the group II element and the second gaseous source material of the group VIB element, both acting as the constituent of the host material of the luminescent layer, and the third gaseous source material of the luminescent center element are supplied into the reaction furnace. These gases are caused to react with each other inside the reaction furnace. Therefore, the flow rates of the gaseous source materials and the manner in which each gas is supplied can be controlled independently. For this reason, if the luminescent layer is binary, deviation of the composition of the luminescent layer from the desired composition can be well prevented. Furthermore, the concentration of the luminescent center in the luminescent layer can be precisely controlled.

Also, in the first feature described above, the first gaseous source material of the group II element is supplied into the central region in the reaction furnace. The second gaseous source material of the group VIB element is supplied to the region surrounding the central region. The second material can advantageously prevent diffusion of the first material inside the furnace. That is, the second material assures that the first material reaches the surface of the insulating substrate. Consequently, the uniformity of the composition of the formed luminescent layer can be improved further.

In the second feature described above, during supply of the first and second gaseous source materials into the reaction furnace, the flow velocity of the first gaseous source material inside the reaction furnace is made greater than the flow velocity of the second gaseous source material inside the reaction furnace. Thus, these two gaseous source materials do not readily react with each other in gas phase inside the reaction furnace. This further stabilizes the composition of the formed luminescent layer.

In the third feature described above, the third gaseous source material is introduced into the reaction furnace after being mixed with the first gaseous source material. This facilitates fabrication of an electroluminescent device having a film composition similar to the above-described film composition.

In the fourth feature described above, the first gaseous source material is an organic compound of the group II element, and that the third gaseous source material is an organic compound of the element acting as the luminescent center. The vaporization temperatures or the sublimation temperatures of these source materials can be lowered by using an organic compound such as tridipivaloylmethanate cerium as the source material of the luminescent center element and by using an organic compound such as tridipivaloylmethanate strontium or bisdipivaloylmethanate calcium as the source material of the group II element. In consequence, the film can be formed stably and easily. The group VIB element can be sulfur, selenium, and a combination thereof.

In the fifth feature described above, if the above-described insulating substrate is a glass substrate, the substrate is heated to 300–600° C. during formation of the luminescent layer. A high-quality film can be stably grown as the luminescent layer by controlling the temperature of the substrate in this way. In this temperature range, no strain is induced in the glass substrate. Also, no restrictions are imposed on the source material of electrodes.

In the sixth feature described above, a gaseous halogen element is supplied into the reaction furnace either independent of the first and second gaseous source materials or after being mixed with the second gaseous source material. Consequently, the emission brightness of the electroluminescent device can be improved further.

In the seventh feature described above, the first gaseous source material of the group II element, the second gaseous source material of the group IIIB element, the third gaseous source material of the group VIB element, all of which act as the host material of the luminescent layer, and the fourth gaseous source material of the luminescent center element are supplied into the reaction furnace. These gases are caused to react with each other inside the furnace to thereby deposite a II-IIIB-VIB compound host material as the luminescent layer on the insulating substrate by chemical vapor deposition. In this way, the luminescent layer is doped with the luminescent center element forming the fourth gaseous source material. The flow rates of the gaseous source materials and the manner in which each gas is supplied are controlled independently. Therefore, if a ternary luminescent layer is formed by chemical vapor deposition, which has been heretofore impossible to carry out, deviation of the composition of the luminescent layer from the desired composition can be well prevented. Also in this case, the concentration of the luminescent center in the luminescent layer can be precisely controlled.

In the eighth feature described above, the first gaseous source material is supplied into the central region in the reaction furnace. The second gaseous source material is supplied into a first region located outside the central region inside the reaction furnace. The third gaseous source material is supplied into an outer region located outside the first region inside the reaction furnace. Diffusion of the first material is advantageously prevented. This assures that the first material reaches the surface of the insulating substrate. Consequently, the composition of the film of the formed luminescent layer can be rendered more uniform.

In the ninth feature described above, the fourth gaseous source material acting as the luminescent center is a trivalent element and introduced into the reaction furnace after being mixed with the second gaseous source material of the group IIIB element. On the other hand, in the tenth feature described above, the fourth gaseous source material is a bivalent element and introduced into the reaction furnace after being mixed with the first gaseous source material of the group II element. In each of these methods, the structure of the machine, or the structure of nozzles, for introducing the gaseous source materials can be simplified without adversely affecting at all the composition of the film forming the luminescent layer.

In the eleventh feature described above, the first and second gaseous source materials are supplied into the central region in the reaction furnace. The third gaseous source material of the group VIB element is supplied into a marginal region inside the reaction furnace. Also in this method, the structure of the machine, or the structure of nozzles, for introducing the gaseous source materials can be simplified without adversely affecting at all the composition of the film forming the luminescent layer.

In the twelfth feature described above, the fourth gaseous source material of the element forming the luminescent center is mixed with that of the first and second gaseous source materials which has a vaporization temperature closer to the vaporization temperature of the fourth gaseous source material and then introduced into the reaction furnace. In this method, the source materials are prevented from decomposing or resolidifying inside the tubes with desirable results.

In the thirteenth feature described above, during supply of the various gaseous source materials, at least the flow velocity of the first gaseous source material of the group II element inside the reaction furnace is made greater than that of the third gaseous source material of the group VIB element inside the reaction furnace. In this method, the first and third materials do not readily react with each other in gas phase inside the reaction furnace. This further stabilizes the composition of the film forming the luminescent layer.

In the fourteenth feature described above, the first, second, and third gaseous source materials can be organic compounds of their respective elements.

The vaporization temperatures or the sublimation temperatures of these source materials can be lowered by using an organic compound such as tridipivaloylmethanate cerium as the source material of the luminescent center element, using an organic compound such as bisdipivaloylmethanate strontium or bisdipivaloylmethanate calcium as the source material of the group II element, and using an organic compound such as triethyl gallium as the source material of the group IIIB element. In consequence, the film can be formed stably and easily. The group VIB element can be sulfur, selenium, and a combination thereof.

In the fifteenth feature described above, if the insulating substrate is a glass substrate, the substrate is heated to 300–600° C. during formation of the luminescent layer. A high-quality film can be stably grown as the luminescent layer by controlling the temperature of the substrate in this way. Within this temperature range, no strain is induced in the glass substrate. Also, no restrictions are imposed on the source material of electrodes.

In the sixteenth feature described above, during formation of the luminescent layer, the pressure inside the reaction furnace is 20–90 torr. The film acting as the luminescent layer can be stably and certainly formed.

In the seventeenth feature described above, a gaseous halogen or halide is supplied into the reaction furnace either independent of the first, second, and third gaseous source materials or after being mixed with the third gaseous source material of the group VIB element. In this method, the emission brightness of the fabricated electroluminescent device can be improved further.

An apparatus for fabricating an electroluminescent device can assume the eighteenth feature described above. In this structure, the first gaseous source material of the group II element, the second gaseous source material of the group VIB element, and the gaseous source material of the luminescent center element are separately introduced into the reaction furnace through the first through third gas supply tubes, respectively. Consequently, neither particles nor subsidiary products are produced. In the conventional vapor phase growth process, such particles or subsidiary products have been produced, thus posing problems.

Furthermore, in this fabrication apparatus, the first gas supply tube for introducing the first source material is laid in the center of the reaction furnace. The gas blowout port in the first tube is located so as to open onto the surface of the substrate. The second gas supply tube for introducing the second source material is laid around the first tube. Therefore, a uniform film can be formed as the binary luminescent layer of the electroluminescent device such that the composition of the film does not deviate from the desired composition.

In the nineteenth feature described above, there is further provided a fourth gas supply tube for supplying a fourth gaseous source material of a group IIIB element into the reaction furnace. The second gas supply tube is laid around the fourth gas supply tube. Moreover, in the twentieth feature described above, there is further provided a fourth gas supply tube for supplying a fourth gaseous source material of a group IIIB element into the reaction furnace. The fourth gas supply tube is laid around the first gas supply tube. The second gas supply tube is laid around the fourth gas supply tube. In this structure, a uniform layer having a composition not deviating from the desired composition can be formed as a ternary luminescent layer of the fabricated electroluminescent device.

In the twenty-first feature described above, the fourth gas supply tube is also used as the third gas supply tube for supplying the gaseous source material of the luminescent center element if the luminescent center element is a trivalent element. If the luminescent center element is a trivalent element, the structure of the tubing of the apparatus is simplified. Of course, the composition of the film of the luminescent layer is not adversely affected at all even if the structure of the tubing of the apparatus is simplified.

Whether the apparatus is designed to form the above-described binary luminescent layer or ternary luminescent layer, if the twenty-second feature described above is adopted, i.e., the first gas supply tube is also used as the third gas supply tube for supplying the gaseous source material of the luminescent center element if the luminescent center element is a bivalent element, then the structure of the tubing of the apparatus is simplified. Nonetheless, the composition of the film of the luminescent layer is not adversely affected at all.

Where the apparatus for forming the above-described ternary luminescent layer adopts the above-described twenty-third feature, i.e., if the vaporization temperature of the source material of the luminescent center element is close to the vaporization temperature of the gaseous source material of the group II element, the third gas supply tube for supplying the gaseous source material of the luminescent center element is used also as the first gas supply tube. Also, if the vaporization temperature of the source material of the luminescent center element is close to the vaporization temperature of the gaseous source material of the group IIIB element, then the third gas supply tube for supplying the source material of the luminescent center element is used as the fourth gas supply tube. In these arrangements, the structure of the tubing is simplified. Furthermore, the source materials are advantageously prevented from decomposing or resolidifying inside the tubes.

Where these fabrication apparatuses adopt the above-described twenty-fourth feature, i.e., the first gas supply tube is so arranged that the gas blowout port thereof is located closer to the surface of the substrate than any other gas blowout ports of other gas supply tubes. As a result, the gaseous source material of the group II element and the gaseous source material of the group VIB element do not readily react with each other in gas phase inside the reaction furnace. This further stabilizes the film composition of the luminescent layer.

Where these fabrication apparatuses adopt the above-described twenty-fifth feature, i.e., there is further provided a fifth gas supply tube for supplying a source material containing a halogen element into the reaction furnace, an electroluminescent device producing higher emission brightness can be fabricated. The structure can be made simpler by using the fifth gas supply tube also as the second gas supply tube for supplying the gaseous source material of the group VIB element.

Where these fabrication apparatuses adopt the above-described twenty-sixth feature, i.e., the exhaust port is located behind the film forming surface side of the substrate, the various tubes, the substrate on which the film is formed, and the exhaust port are arranged substantially in line with respect to the flows of any gases in the reaction furnace. Therefore, it is easy to control the flow of the gaseous source materials inside the reaction furnace. Furthermore, a high-quality luminescent layer can be formed at a high deposition rate.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

FIRST EXAMPLE

Figure 1:
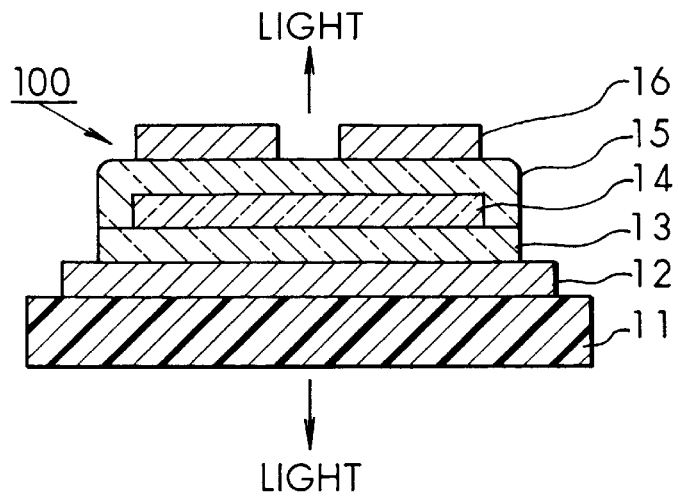
FIG. 1 is a schematic cross sectional view of an electroluminescent device fabricated by a method according to the present invention.

The cross-sectional structure of an electroluminescent device fabricated according to a first example of the present invention is schematically shown in FIG. 1. This electroluminescent device, generally indicated by reference numeral 100, acts to extract light in the directions indicated by the arrows. The device 100 comprises a glass substrate 11 which is an insulating substrate, together with various thin films stacked on the substrate 11 in the manner described below.

A first transparent electrode layer 12 made of optically transparent zinc oxide (ZnO) is formed on the glass substrate 11. A first dielectric layer 13 made of optically transparent tantalum pentoxide ($Ta_2O_5$) is formed on the top surface of the first electrode layer 12.

A luminescent layer 14, the host material of which is of strontium sulfide (SrS), is formed on the first dielectric layer 13. Cerium (Ce) is added to the strontium sulfide as a luminescent center. A second dielectric layer 15 made of optically transparent tantalum pentoxide ($Ta_2O_5$) is formed so as to cover the luminescent layer 14.

A second transparent electrode layer 16 made of optically transparent zinc oxide (ZnO) is formed on the second dielectric layer 15. Thus, the electroluminescent device is completed. The thin-film electroluminescent device 100 is fabricated in the manner described now.

First, the first transparent electrode layer 12 is deposited on the glass substrate 11 by an ion plating machine (not shown). To prepare the material of the electrode layer 12, gallium oxide ($Ga_2O_3$) is added to powdered zinc oxide (ZnO), and they are mixed up. The mixture is then shaped into a pellet.

More specifically, the inside of the ion plating machine is evacuated while maintaining the temperature of the glass substrate 11 constant. Then, argon (Ar) gas is introduced, and the pressure is maintained constant. The beam power and the RF power are adjusted in such a manner that the deposition rate is within the range of 6 to 18 nm/min.

Then, the first dielectric layer 13 of tantalum pentoxide ($Ta_2O_5$) is formed on the first transparent electrode layer 12 by sputtering techniques. In particular, mixture gas of argon (Ar) and oxygen ($O_2$) is introduced into the sputtering machine. The film is formed with RF power of 1 kW.

Figure 2:
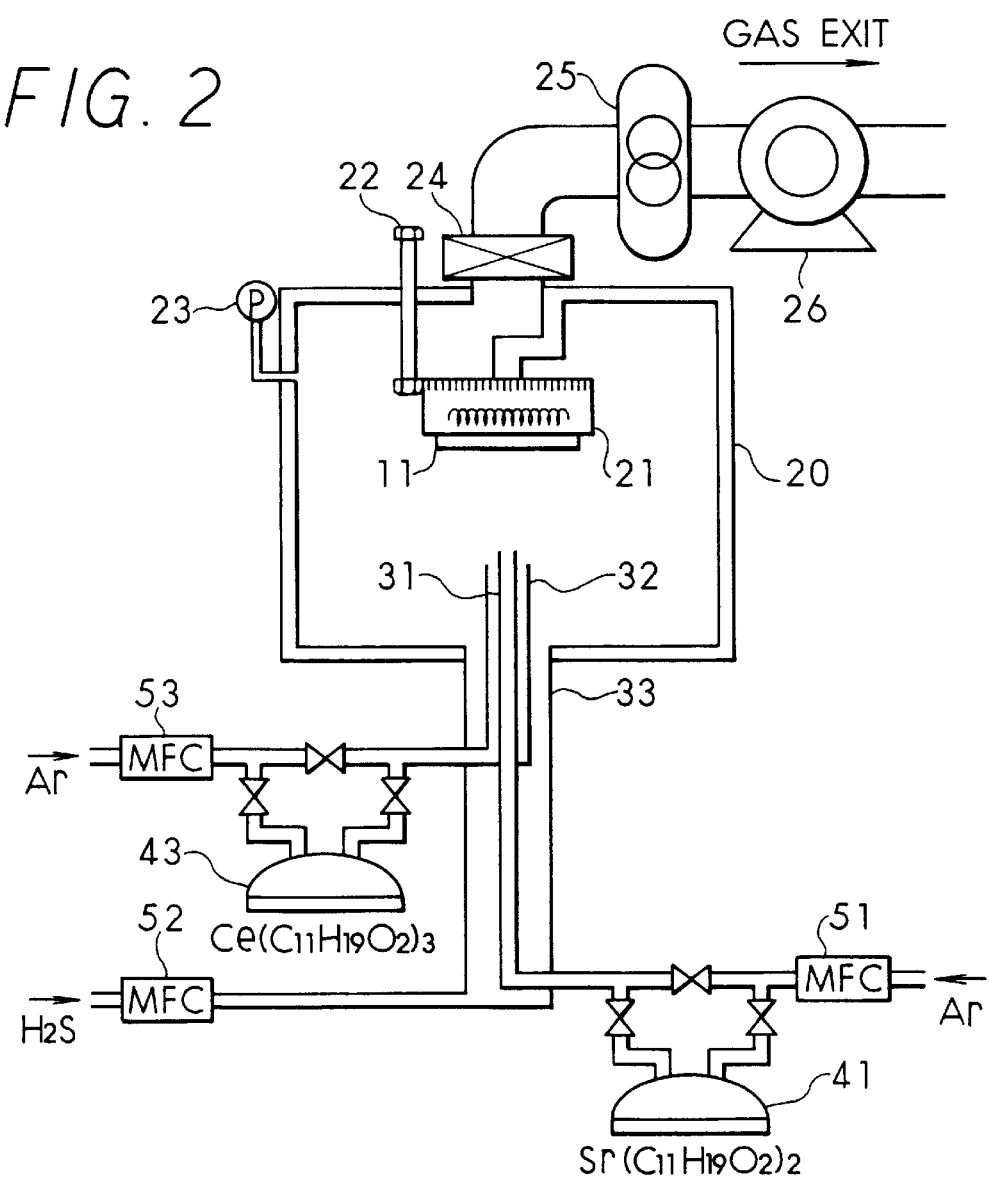
FIG. 2 is a schematic diagram of an MOCVD machine for fabricating an electroluminescent device according to a first example of the invention.

Thereafter, strontium sulfide (SrS) to which cerium (Ce) is added as a luminescent center is grown on the first dielectric layer 13 as a luminescent layer 14. To form the luminescent layer 14, an MOCVD (metal organic chemical vapor deposition) machine as shown in FIG. 2 is used.

More specifically, the luminescent layer 14 is formed in the sequence described below. First, the glass substrate 11 on which the first transparent electrode layer 12 and the first dielectric layer 13 have been formed is mounted to a susceptor 21 capable of rotating inside a reaction furnace 20. The rotational frequency of the susceptor 21 can be controlled. The susceptor 21 is rotated at 5 rpm via a rotation control rod 22.

The glass substrate 11 is maintained at a constant temperature of 500° C. via the susceptor 21. The flow rate of expelled gas is controlled by a pressure regulator (not shown) down to a subatmospheric pressure of 5 torr while monitoring the pressure inside the reaction furnace 20 with a pressure gauge 23. The gas is expelled through a gate valve 24, a mechanical booster pump 25, and a rotary pump 26.

Thereafter, as a II-group element source material, bis-dipivaloylmethanate strontium ($Sr(C_{11}H_{19}O_2)_2$) is used together with a carrier gas of argon (Ar). As a VIB-group element source material, Sulfur (S), specifically hydrogen sulfide ($H_2S$) is used. As a gaseous source material forming a luminescent center, tridipivaloylmethanate cerium (Ce ($C_{11}H_{19}O_2)_3$) is used together with a carrier gas of argon (Ar). These three source materials are introduced into the reaction furnace 20, and the thin film 14 of strontium sulfide (SrS) doped with cerium (Ce) is formed.

In this example, the bisdipivaloylmethanate strontium ($Sr(C_{11}H_{19}O_2)_2$) is used as the source material of the strontium (Sr), while the hydrogen sulfide ($H_2S$) is used as the source material of the sulfur (S). With respect to the amounts of supply of these source materials, an excessive amount of hydrogen sulfide ($H_2S$) is supplied compared with a stoichiometric ratio (in this case 1:1).

More specifically, with respect to the bisdipivaloylmethanate strontium ($Sr(C_{11}H_{19}O_2)_2$), this is loaded into a solid source material container or tank 41 and heated to 230° C. so that it may sublimate. This sublimated source material is transported into the reaction furnace 20, using argon (Ar) gas whose flow rate is controlled to 1,400 cc/min by a mass flow controller 51. This gaseous source material is supplied onto the surface of the glass substrate 11 (strictly, the first dielectric layer 13) through a gas supply tube 31.

With respect to the hydrogen sulfide ($H_2S$) used as the source material of sulfur (S), it is diluted with argon (Ar). Then, the hydrogen sulfide ($H_2S$) is introduced into the reaction furnace 20 while controlling the gas flow rate to 250 cc/min with a mass flow controller 52. This gaseous source material is supplied onto the surface of the glass substrate 11 (strictly, the first dielectric layer 13) through a gas supply tube 33. The area of the blowout hole in the gas supply tube 31 is set less than the area of the blowout hole in the gas supply tube 33 so that the gas flow velocity of the bisdipivaloylmethanate strontium ($Sr(C_{11}H_{19}O_2)_2$) is greater than that of the hydrogen sulfide ($H_2S$). In particular, the flow rate of the gas discharged out of the gas supply tube 31 is 470 mm/sec, whereas the flow rate of the gas discharged out of the gas supply tube 33 is 2 mm/sec.

The inventors have experimentally discovered that a II-group element source material such as strontium (Sr) or zinc (Zn) readily reacts with a VIB-group element source material in gas phase. Accordingly, in order that these source materials react with each other on the surface of the glass substrate 11, the gas flow velocity of the supplied bisdipivaloylmethanate strontium ($Sr(C_{11}H_{19}O_2)_2$) which is a II-group element source material is set greater than that of the hydrogen sulfide ($H_2S$) that is a VIB-group element source material.

With respect to the addition of the element forming the luminescent center, the tridipivaloylmethanate cerium (Ce ($C_{11}H_{19}O_2)_3$) which is the material of the luminescent center and loaded in the solid source material container or tank 43 is kept warmed at a constant temperature of 145° C. The sublimated source material is introduced into the reaction furnace 20, using argon (Ar) whose flow rate is controlled to 400 cc/min by a mass flow controller 53. This gaseous source material forming the luminescent center is supplied onto the surface of the glass substrate 11 (strictly, the first dielectric layer 13) through the gas supply tube 32.

As is well known in the art, the mass flow controllers 51–53 automatically control the flow rates of the relevant gases according to flow rate values specified by control units (not shown).

Figure 3:
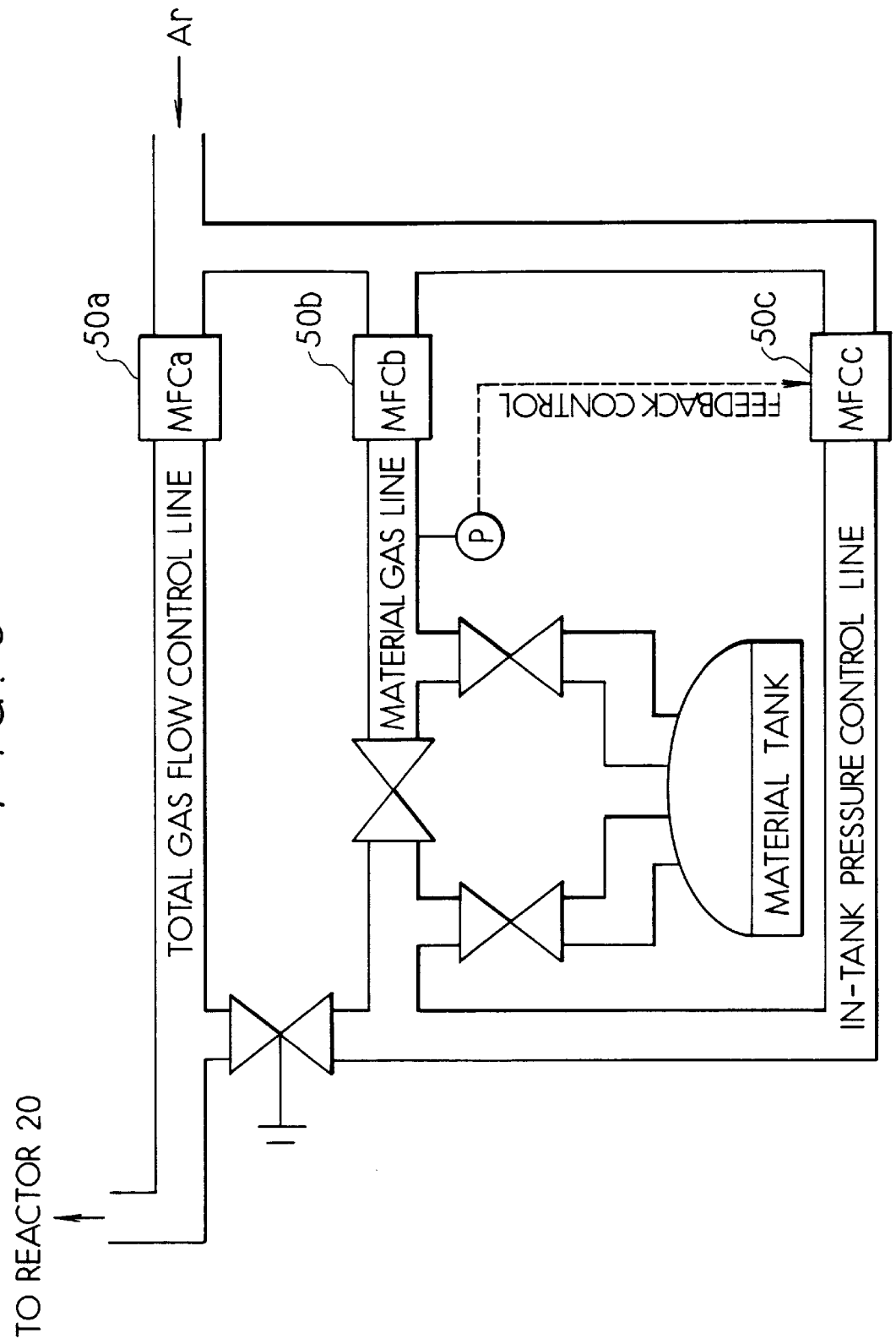
FIG. 3 is a schematic diagram of various pipes for supplying source materials according to the first example of the invention.

The source material supply tubes in which the mass flow controllers are respectively installed are provided with gas flow-adjusting lines which are not shown in FIG. 2 but are installed in the manner as illustrated in FIG. 3. The gas flow velocities of the gaseous source materials inside the reaction furnace 20 can be controlled by controlling the gas flow rates in these lines. Therefore, in the configuration shown in FIG. 3, the aforementioned gas flow rates are the sum of the gas flow rates controlled by flow controllers 50a–50c, which is expressed as:

gas flow rate=MFCa+MFCb+MFCc.

In modifications and other examples described later, the source material supply tubes in the MOCVD machine are all constructed similarly to the structure shown in FIG. 3.

The thin film 14 of strontium sulfide (SrS) doped with cerium (Ce) was grown by the method described thus far. A deposition rate of 11 nm/min was obtained. That is, the above-described fabrication method provides a film deposition rate about 10 times as high as the deposition rate achieved by the prior art atomic layer epitaxy (ALE).

After forming the luminescent layer 14 in this way, the second dielectric layer 15 is formed out of tantalum pentoxide ($Ta_2O_5$) in the same way as the first dielectric layer 13. Then, the second transparent electrode layer 16 is formed out of zinc oxide (ZnO) in the same manner as the first transparent electrode layer 12 described above.

The first and second transparent electrode layers 12 and 16, respectively, are 300 nm thick when measurements are made at their centers. The first and second dielectric layers 13 and 15, respectively, are 400 nm thick. The luminescent layer 14 is 800 nm thick.

Electroluminescent devices were actually fabricated by the method described thus far. Samples were created under optimum various conditions. The emission brightnesses obtained when an AC voltage of 400 Hz was applied to the electroluminescent device samples were measured. The relation of the emission brightness to the applied voltage is shown in the graph of FIG. 4.

Figure 4:
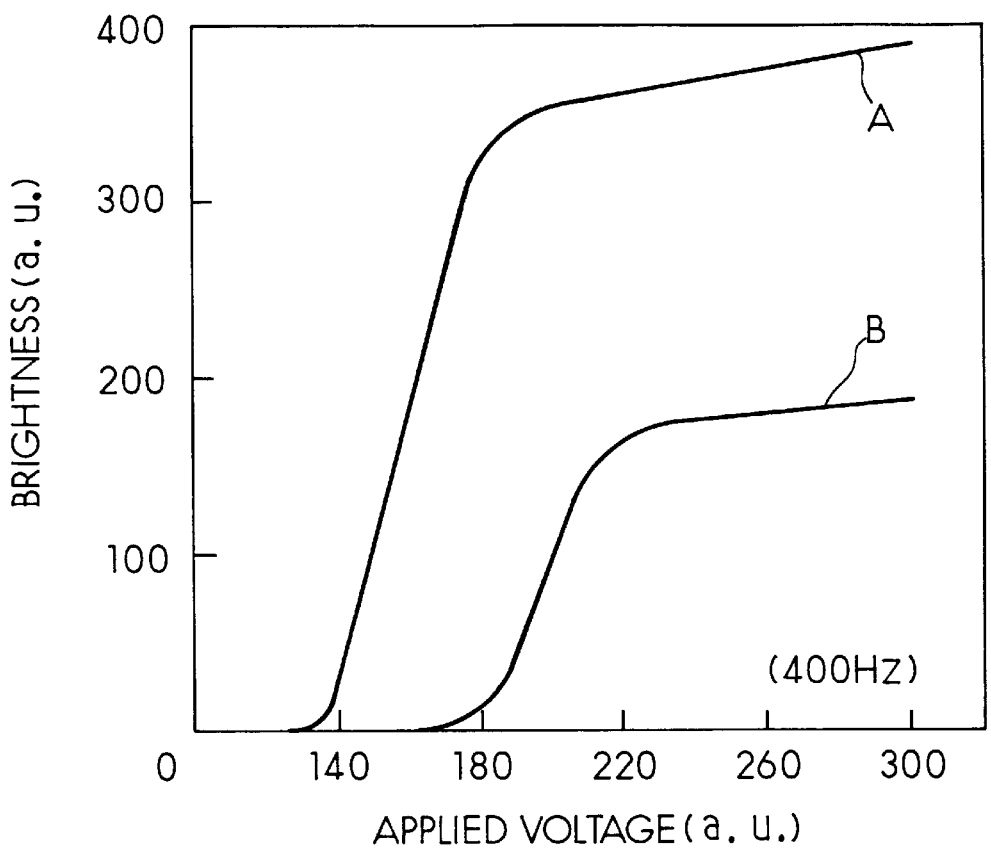
FIG. 4 is a graph showing the emission brightness-applied voltage characteristics of an electroluminescent device fabricated according to the first example.

In FIG. 4, characteristic curve A indicates the emission brightness of electroluminescent devices fabricated by the first example of method described above against the applied voltage. Characteristic curve B indicates the emission brightness of electroluminescent devices fabricated by the prior art fabrication method against the applied voltage.

In the prior art fabrication method, a luminescent layer in the form of a thin film of strontium sulfide (SrS) doped with cerium (Ce) is formed by sputtering techniques.

More specifically, a target made of strontium sulfide (SrS) doped with cerium (Ce) was baked under pressure. During the formation of the film, the pressure was 4 Pa. The applied electric power was 250 W. Presputtering was done for 20 minutes. At this time, the luminescent layer was grown at a rate of 45 nm/min. The film thickness was 800 nm. The electroluminescent device using this luminescent layer was identical in structure to the device of the first example described above.

As can be seen from FIG. 4, the emission brightness of the electroluminescent devices fabricated by the above-described method can be improved greatly over the emission brightness of the prior art electroluminescent devices. Furthermore, the emission threshold voltages of the novel devices can be shifted toward lower voltages. Consequently, the sensitivity can be improved. The inventors measured the amounts of luminescent centers contained in the luminescent layers and have found that the electroluminescent devices fabricated by the first example of method are much superior to the devices fabricated by the prior art method in reproducibility and easiness with which the amount of the contained luminescent center is controlled.

In addition, in the first example of method, production of particles due to subsidiary products was prevented. As a result, highly reliable electroluminescent devices could be fabricated.

In the fabrication machine according to the first example already described in connection with FIG. 2, the above-described gaseous source materials are introduced from immediately under the glass substrate 11, and then are expelled from the rear surface side of the substrate 11, i.e., behind the substrate 11 and over the susceptor 21, to control the pressure.

Therefore, the introduced gaseous source materials are uniformly supplied to the front surface of the glass substrate 11 on which films are to be formed. Furthermore, the flow of these source materials inside the reaction furnace 20 can be controlled with greater ease.

In the first example described above, the glass substrate 11 is kept heated at 500° C. Experiment has shown that where the substrate was heated to 300 to 600° C., the thin film 14 of strontium sulfide (SrS) doped with cerium (Ce) could be grown. However, in order to grow a luminescent layer of high quality, the substrate is preferably heated to 350 to 550° C.

In the fabrication machine according to the first example previously described in connection with FIG. 2, the glass substrate 11 to which the luminescent layer 14 should be formed is fixedly mounted to the susceptor 21 equipped with a heater. During the formation of the layer, the substrate temperature is controlled by providing feedback control utilizing a thermocouple.

It is to be noted that the substrate temperatures so far described indicates the temperature set into the fabrication machine. The inventors consider that the actual substrate temperature is lowered by 100 to 200° C. owing to the blowing of the gaseous source materials.

Figure 5:
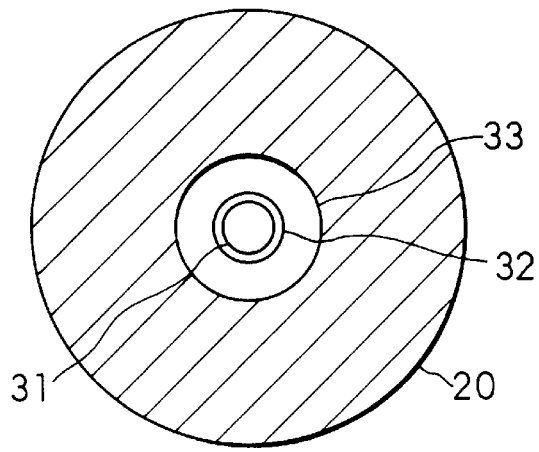
FIG. 5 is a schematic plan view of a gaseous source material supply pipe used in the first example of the invention.

Also, in the fabrication machine according to the first example previously described in connection with FIG. 2, the gaseous source material supply tubes are arranged inside the reaction furnace 20 in such a way that the gaseous source materials do not react with each other in gas phase as shown in FIG. 5 and that the gases can be uniformly supplied onto the whole surface of the substrate on which films are to be grown.

In particular, the gas supply tube 31 for supplying bisdipivaloylmethanate strontium ($Sr(C_{11}H_{19}O_2)_2$) is laid in the center. The gas supply tube 32 for supplying tridipivaloylmethanate cerium ($Ce(C_{11}H_{19}O_2)_3$) that is the source material of the luminescent center is laid around the tube 31. The hydrogen sulfide ($H_2S$) which is used as the source material of the sulfur (S) is introduced through the gas supply tube 33 located under the reaction furnace 20 so that an excessive amount of hydrogen sulfide can stay inside the furnace 20. Thus, the supply of the hydrogen sulfide will not greatly impede the flow of the source materials of strontium (Sr) and cerium (Ce).

Figure 6:
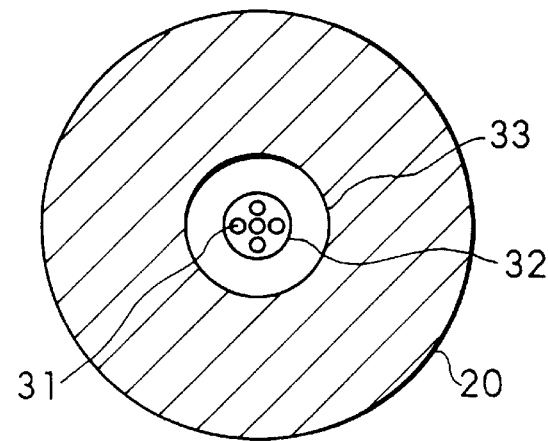
FIG. 6 is a schematic plan view of another gaseous source material supply pipe used in the first example of the invention.

The arrangement of these gaseous source material supply tubes is not limited to the above-described scheme. For example, as shown in FIG. 6, a plurality of gas supply tubes 31 for supplying the bisdipivaloylmethanate strontium (Sr $(C_{11}H_{19}O_2)_2$) may be laid inside the gas supply tube 32 for supplying the tridipivaloylmethanate cerium ($Ce(C_{11}H_{19}O_2)_3$) that is the source material of the luminescent center. In this case, a luminescent layer of more uniform film composition could be obtained.

Figure 7:
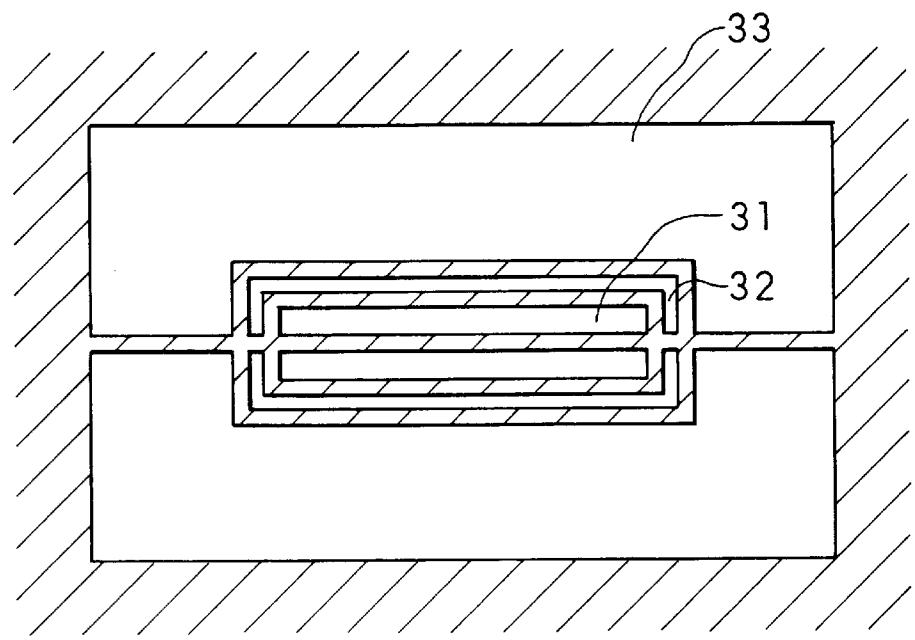
FIG. 7 is a schematic plan view of a further gaseous source material supply pipe used in the first example of the invention.
Figure 8:
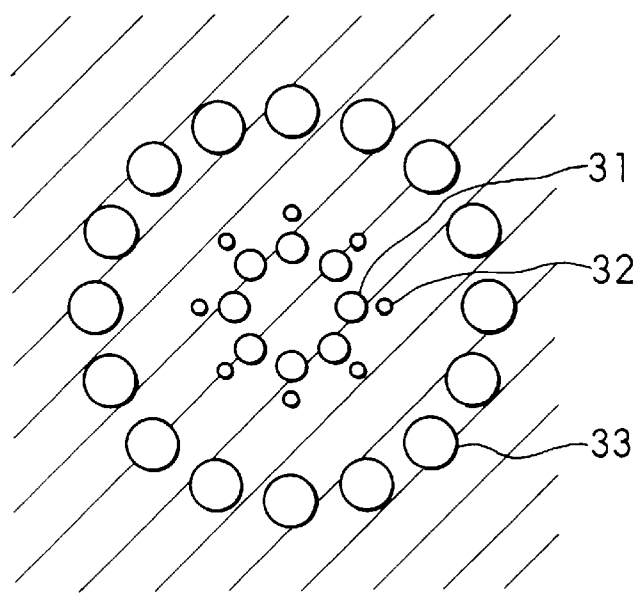
FIG. 8 is a schematic plan view of a yet other gaseous source material supply pipe used in the first example of the invention.

Moreover, these gaseous source material supply tubes can be arranged and shaped as shown in FIGS. 7 and 8. With respect to the gas supply tube 31 for the bisdipivaloylmethanate strontium ($Sr(C_{11}H_{19}O_2)_2$) and the gas supply tube 32 for the tridipivaloylmethanate cerium ($Ce(C_{11}H_{19}O_2)_3$), each supply tube can have a rectangular blowout port or have a plurality of blowout ports. Similarly, the gas supply tube 33 for the hydrogen sulfide ($H_2S$) can have a rectangular blowout port around the gas supply tubes 31 and 32 or have a plurality of blowout ports.

Figure 9:
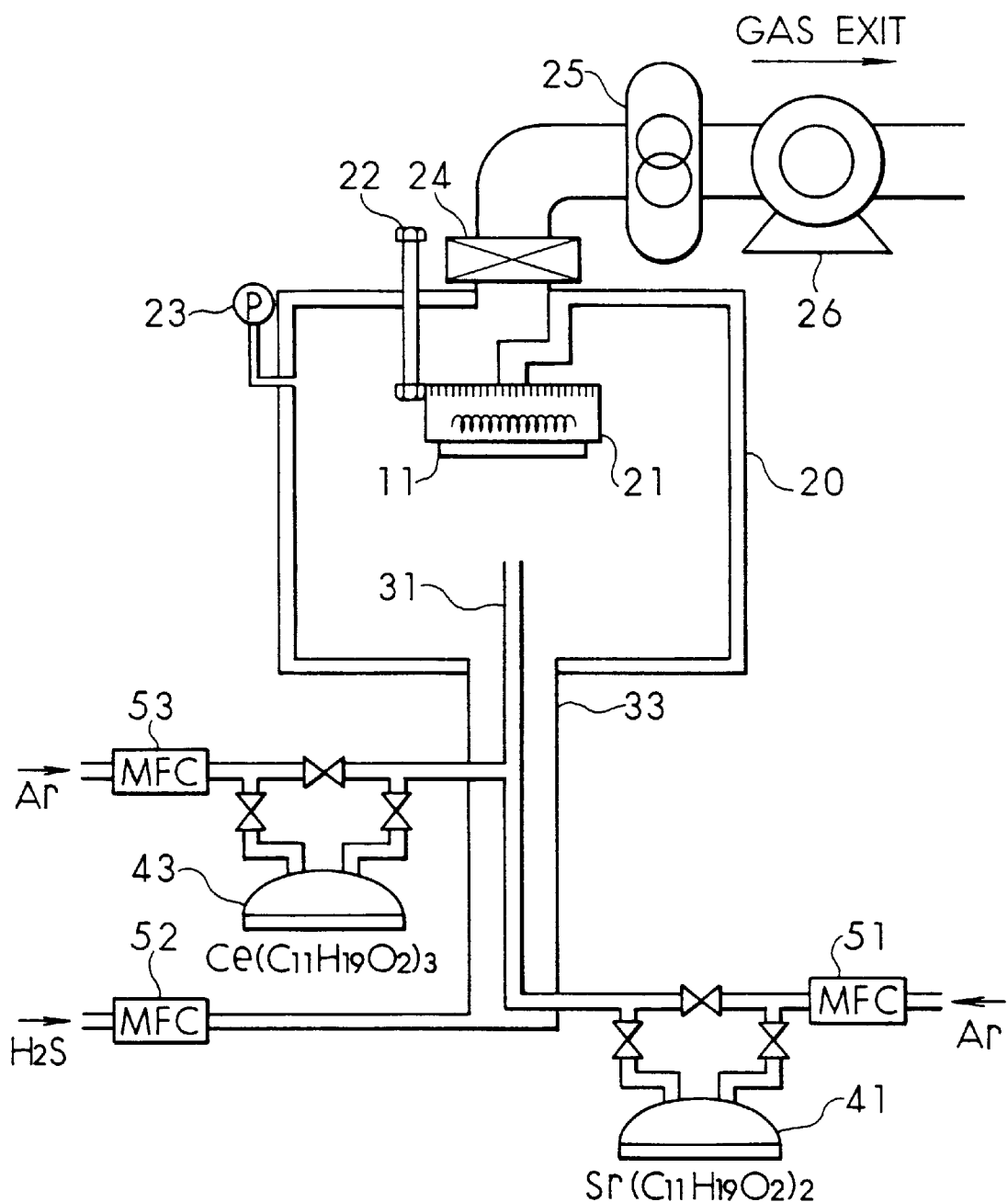
FIG. 9 is a schematic diagram of another machine for fabricating an electroluminescent device, the machine being built according to the first example.

In the first example described above, the tridipivaloylmethanate cerium ($Ce(C_{11}H_{19}O_2)_3$) that is the gaseous source material of the luminescent center is supplied by the use of the gas supply tube 32 independent of the other gases.

Where it is desired to simplify the structure of the CVD machine, however, as shown in FIG. 9, the tridipivaloylmethanate cerium ($Ce(C_{11}H_{19}O_2)_3$) gas can be mixed with the source material of the strontium, i.e., the bisdipivaloylmethanate strontium ($Sr(C_{11}H_{19}O_2)_2$) which is a II-group element source material. Then, the mixture gas can be supplied onto the surface of the glass substrate 11 (strictly, the first dielectric layer 13) through the common gas supply tube 31.

Figure 10:
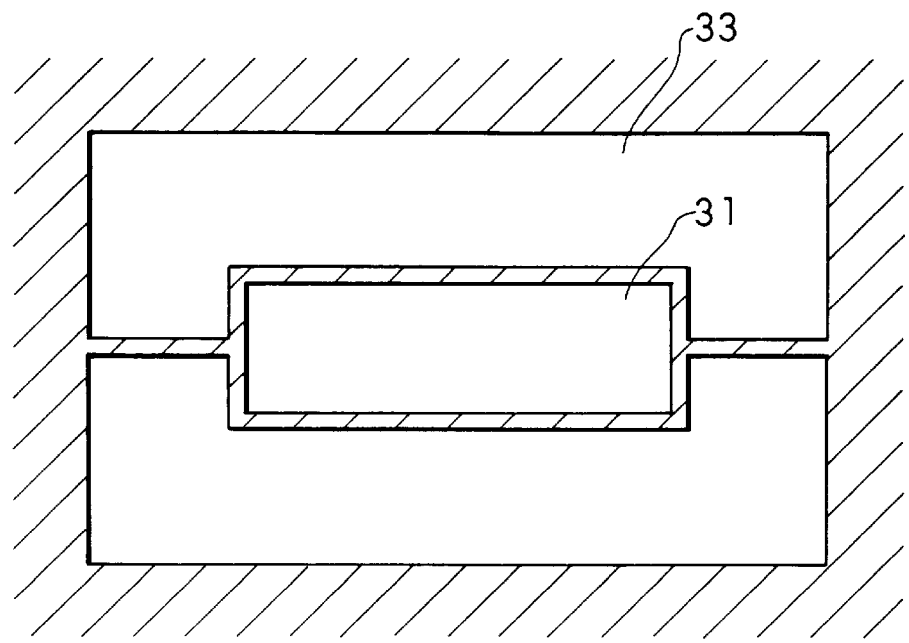
FIG. 10 is a schematic plan view of a gaseous source material supply pipe used in the machine shown in FIG. 9.
Figure 11:
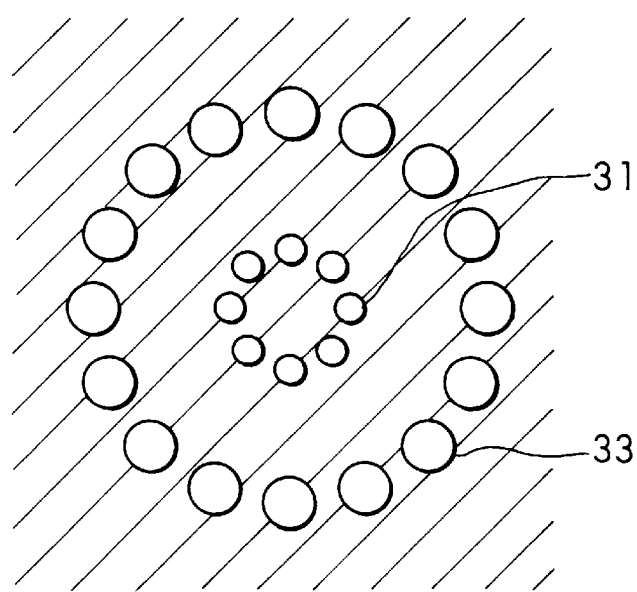
FIG. 11 is a schematic plan view of another gaseous source material supply pipe used in the machine shown in FIG. 9.

In this case, these gaseous source material supply tubes can be arranged and shaped as shown in FIGS. 10 and 11. With respect to the gas supply tube 31 used for both bisdipivaloylmethanate strontium ($Sr(C_{11}H_{19}O_2)_2$) and tridipivaloylmethanate cerium ($Ce(C_{11}H_{19}O_2)_3$), the tube can have a rectangular blowout port or have a plurality of blowout ports. Similarly, the gas supply tube 33 for the hydrogen sulfide ($H_2S$) can have a rectangular blowout port around the gas supply tubes 31 and 32 or have a plurality of blowout ports. By adopting these arrangement and shapes for the gaseous source material supply tubes, the aforementioned CVD machine can be built with a relatively simple structure.

In the fabrication machine according to the first example already described in conjunction with FIG. 2, the source material containers or tanks 41 and 43 may be arranged arbitrarily. That is, the source material container or tank 41 for the strontium may be positioned closer to the reaction furnace 20.

In the first example described above, hydrogen sulfide ($H_2S$) is used as the source material of the sulfur (S) which is a VIB-group element. Diethyl sulfur ($S(C_2H_5)_2$) used along with a carrier gas of argon (Ar) may be employed as a source material of the sulfur (S) similarly.

In the first example described above, cerium (Ce) is used as the luminescent center to obtain an electroluminescent device emitting blue light. Europium (Eu) or other element may also be used as the luminescent center. Where europium (Eu) is used, it is necessary to use another source material container or tank for loading the component of the luminescent center.

Furthermore, it is possible to add cerium and europium simultaneously as luminescent centers. In this case, white light can be emitted by appropriately adjusting the amount of addition. Blue light can be obtained by filtering out undesired wavelengths of the white light.

SECOND EXAMPLE

A second example of the present invention is next described. Electroluminescent devices fabricated according to the second example are similar in cross-sectional structure to the structure already described in connection with FIG. 1 except that the luminescent layer 14 is made of calcium thiogallate ($CaGa_2S_4$) to which cerium (Ce) is added as a luminescent center.

The thin-film electroluminescent device 100 according to the second example is fabricated in the manner described now. The first transparent electrode layer 12 and the first dielectric layer 13 made of tantalum pentoxide ($Ta_2O_5$) are successively formed onto the glass substrate 11 in the same way as in the first example described previously. Then, a luminescent layer is formed out of calcium thiogallate ($CaGa_2S_4$) on the first dielectric layer 13 by an MOCVD machine shown in FIG. 12. Cerium (Ce) has been added as a luminescent center to the calcium thiogallate.

Figure 12:
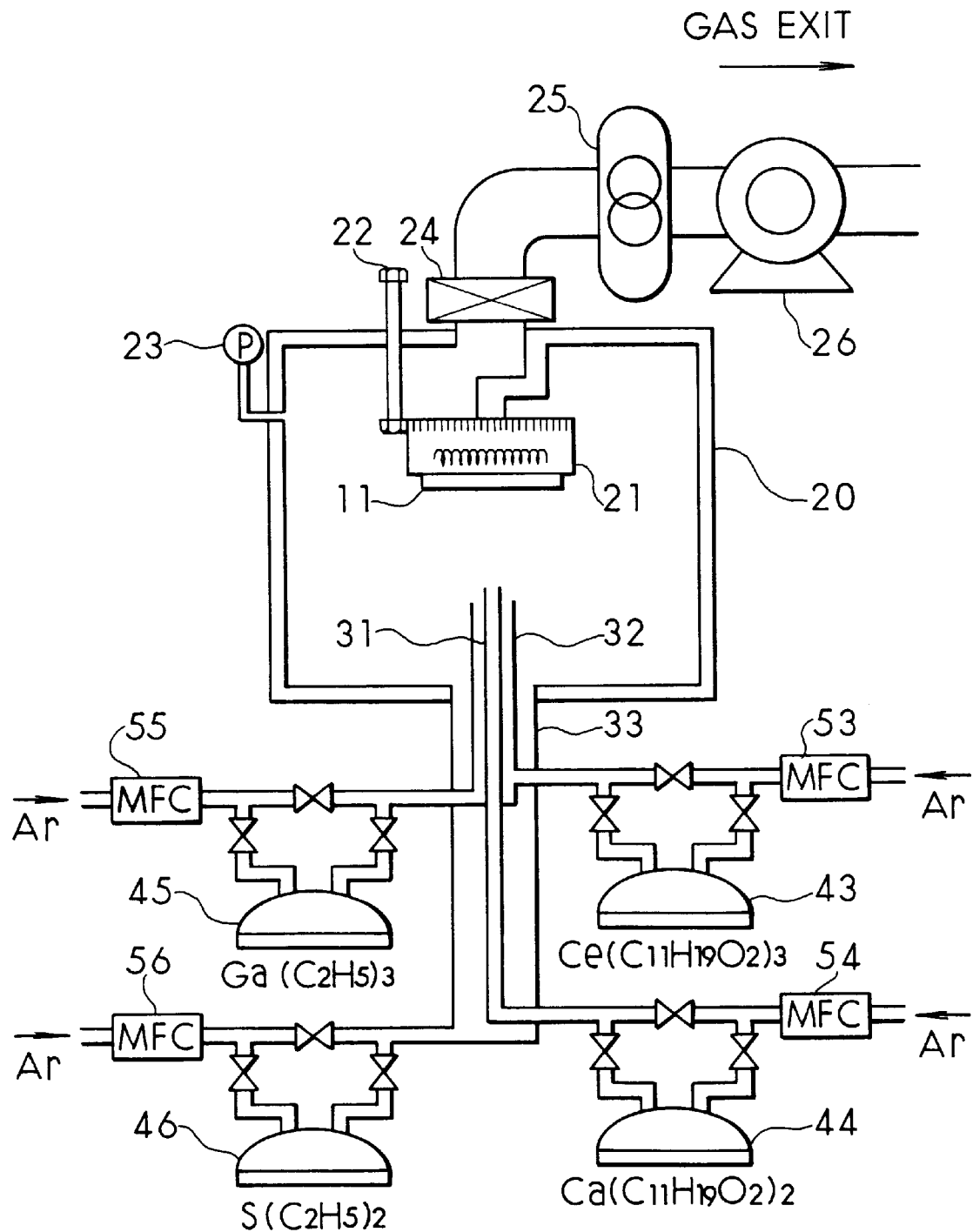
FIG. 12 is a schematic diagram of a machine for fabricating an electroluminescent device according to a second example of the invention.

It is to be noted that like components are indicated by like reference numerals in various figures including FIGS. 2 and 12, where two MOCVD machines are shown.

In particular, also in the second example, the following operations are similarly conducted:

(a) The glass substrate 11 on which the first transparent electrode layer 12 and the first dielectric layer 13 have been formed is mounted to the susceptor 21 capable of rotating inside the reaction furnace 20. The rotational frequency of the susceptor can be controlled. The susceptor 21 is rotated at 5 rpm via the rotation control rod 22.

(b) The glass substrate 11 is maintained at a constant temperature (in this case, 540° C.) via the susceptor 21.

(c) The flow rate of expelled gas is controlled by the pressure regulator (not shown) down to a subatmospheric pressure (in this case, 50 torr) while monitoring the pressure inside the reaction furnace 20 with the pressure gauge 23.

(d) The gas is expelled through the gate valve 24, the mechanical booster pump 25, and the rotary pump 26.

Then, as a II-group element gaseous source material, bisdipivaloylmethanate calcium ($Ca(C_{11}H_{19}O_2)_2$) is introduced along with a carrier gas of argon (Ar) into the reaction furnace 20. As a IIIB-group element gaseous source material, triethyl gallium ($Ga(C_2H_5)_3$) is introduced, together with a carrier gas of argon (Ar). As a VIB-group element gaseous source material, diethyl sulfur ($S(C_2H_5)_2$) is introduced, together with a carrier gas of argon. As a gaseous source material forming a luminescent center, tri-dipivaloylmethanate cerium ($Ce(C_{11}H_{19}O_2)_3$) is introduced, along with a carrier gas of argon (Ar). In this way, a thin film 14 of calcium thiogallate ($CaGa_2S_4$) doped with cerium (Ce) is formed.

In this example, the flow rate of the supplied triethyl gallium ($Ga(C_2H_5)_3$) is set stoichiometrically greater than the flow rate of the supplied bisdipivaloylmethanate calcium ($Ca(C_{11}H_{19}O_2)_2$). Additionally, the flow rate of the supplied diethyl sulfur ($S(C_2H_5)_2$) is set stoichiometrically greater than the flow rate of the supplied bisdipivaloylmethanate calcium ($Ca(C_{11}H_{19}O_2)_2$). In these cases, the stoichiometric ratio is 1:2:4.

That is, with respect to the bisdipivaloylmethanate calcium ($Ca(C_{11}H_{19}O_2)_2$), this is loaded into a solid source material container or tank 44 and heated to 220° C. so that it may sublimate. This sublimated source material is transported into the reaction furnace 20, using argon (Ar) gas whose flow rate is controlled to 1,000 cc/min by a mass flow controller 54. This gaseous source material is supplied onto the surface of the glass substrate 11 (strictly, the first dielectric layer 13) through the gas supply tube 31. At this time, the rate at which the gas is blown out of the gas supply tube 31 is 330 mm/sec.

With respect to the triethyl gallium ($Ga(C_2H_5)_3$) filled in a liquid source material container or tank 45, this liquid is kept cooled at a temperature of 11° C. to vaporize it. The resulting triethyl gallium vapor is transported into the reaction furnace 20 by a carrier of argon (Ar) whose flow rate is controlled to 600 cc/min by a mass flow controller 55. This gaseous source material is supplied onto the surface of the glass substrate 11 (strictly, the first dielectric layer 13) through the gas supply tube 32. At this time, the rate at which the gas is blown out of the gas supply tube 32 is 220 mm/sec.

With respect to the diethyl sulfur ($S(C_2H_5)_2$) used as a source material of sulfur (S), this diethyl sulfur is loaded into a liquid source material container or tank 46 and kept warmed at 37° C. to evaporate it. The produced source material vapor is introduced into the reaction furnace 20 through the use of a carrier gas of argon (Ar) whose flow rate is controlled to 250 cc/min with a mass flow controller 56. This gaseous source material is supplied onto the surface of the glass substrate 11 (strictly, the first dielectric layer 13) through the gas supply tube 33.

In the same way as in the case of the first example, the area of the blowout port in the gas supply tube 31 is set smaller than that of the gas supply tube 33 so that the gas flow velocity of the bisdipivaloylmethanate calcium ($Ca(C_{11}H_{19}O_2)_2$) is greater than that of the diethyl sulfur ($S(C_2H_5)_2$) inside the reaction furnace 20. Specifically, the rate at which gas is blown out of this gas supply tube 33 is 2 mm/sec. In this connection, as already described in connection with the first example, it is empirically known that a II-group element source material (in this example, calcium) readily reacts with a VIB-group element source material (in this case, sulfur (S)) in gas phase.

In order that these gaseous source materials react with each other on the surface of the glass substrate 11, the flow rate of the supplied II-group element source material, or the bisdipivaloylmethanate calcium ($Ca(C_{11}H_{19}O_2)_2$) is set greater than that of the VIB-group element source material, or the diethyl sulfur ($S(C_2H_5)_2$).

When the element forming a luminescent center is added, tridipivaloylmethanate cerium ($Ce(C_{11}H_{19}O_2)_3$) which is put in the solid source material container or tank 43 and is a source material of the luminescent center is kept warmed at a temperature of 145° C. The sublimated source material is then introduced into the reaction furnace 20 by the use of argon (Ar) whose flow rate is controlled to 400 cc/min by the mass flow controller 53. This gas serving as the source material of the luminescent center is supplied onto the surface of the glass substrate 11 (strictly, the first dielectric layer 13) through the gas supply tube 32.

The thin film 14 of calcium thiogallate ($CaGa_2S_4$) to which cerium (Ce) is added as a luminescent center is grown by this method. Then, in the same way as in the case of the first example, the second dielectric layer 15 is formed on the film 14 out of tantalum pentoxide ($Ta_2O_5$) by the same process as used to form the first dielectric layer 13. The second transparent electrode layer 16 is formed on the second dielectric layer 15 out of zinc oxide (ZnO) by the same process as used for the formation of the first transparent electrode layer 12.

In the same way as in the case of the first example described previously, the first and second transparent electrode layers 12 and 16, respectively, are 300 nm thick when measurements are made at their centers. The first and second dielectric layers 13 and 15, respectively, are 400 nm thick. The luminescent layer 14 is 800 nm thick.

Electroluminescent devices were actually fabricated by the method described thus far. In this case, depending on the ratio among the supplied flow rates of the II-group element, the IIIB-group element, and the VIB-group element, subsidiary products such as calcium sulfide (CaS) and gallium sulfide ($Ga_2S_3$) are formed other than the host material, or calcium thiogallate ($CaGa_2S_4$).

Figure 13:
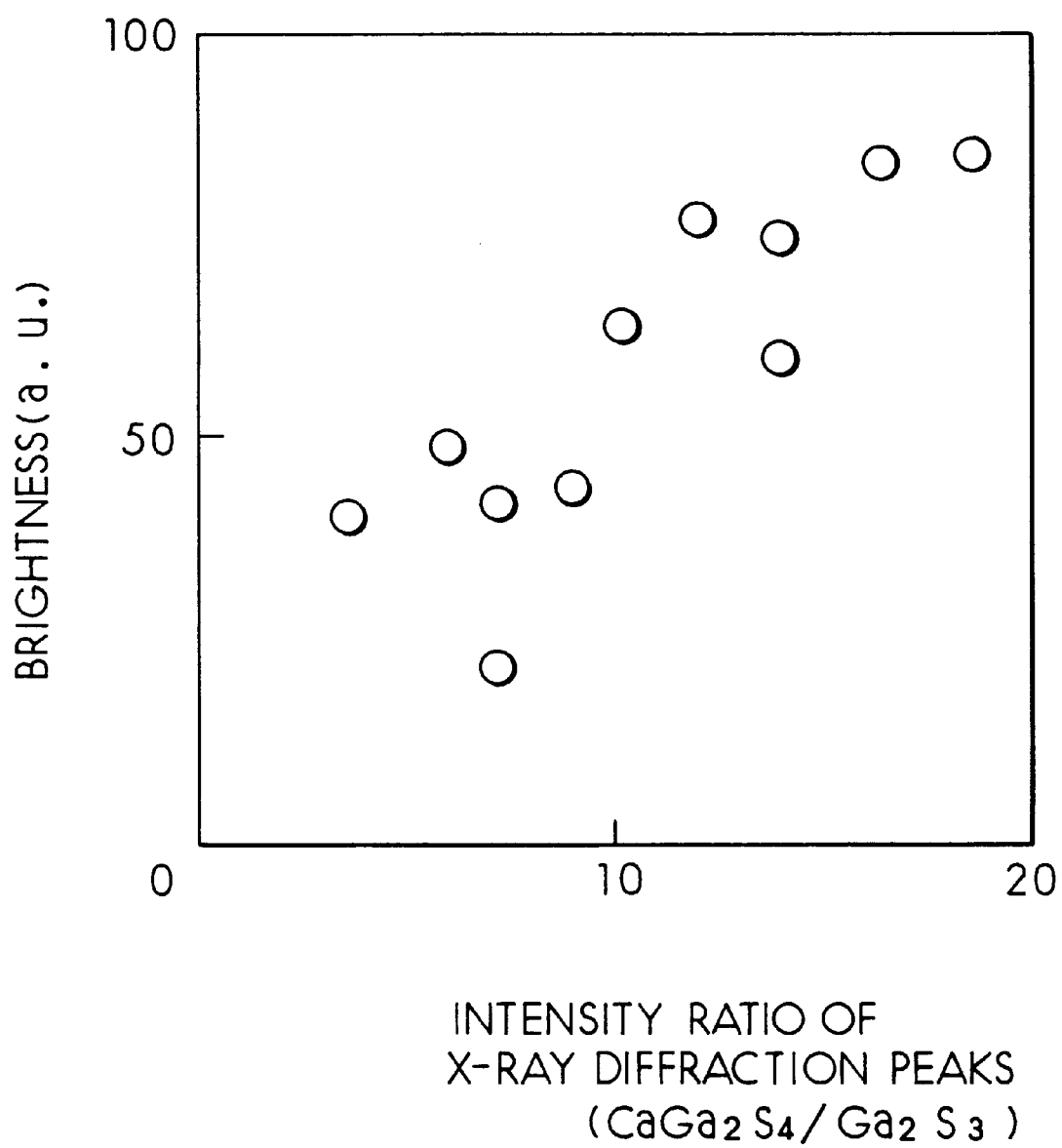
FIG. 13 is a graph showing the relationship of the emission brightness of the electroluminescent device according to the second example to the ratio of the main peak intensity arising from calcium thiogallate to the main peak intensity arising from gallium sulfide where the luminescent layer is irradiated with X-rays.

FIG. 13 is a graph showing the relation of the emission brightness of the luminescent layer of the calcium thiogallate ($CaGa_2S_4$) to the ratio of the intensity of the main diffraction peak arising from the gallium sulfide ($Ga_2S_3$), or a subsidiary product, to the intensity of the main diffraction peak arising from the calcium thiogallate ($CaGa_2S_4$) where the luminescent layer is irradiated with the Cu K$\alpha$ X-ray.

It can be seen from FIG. 13 that as the intensity of the main peak ascribed to the gallium sulfide ($Ga_2S_3$) decreases compared with the intensity of the main peak ascribed to the calcium thiogallate ($CaGa_2S_4$), i.e., as the percentage of the gallium sulfide ($Ga_2S_3$) which is a subsidiary product decreases, the emission brightness is improved.

Samples were created under optimum various conditions. The emission brightnesses obtained when an AC voltage of 400 Hz was applied to the electroluminescent device samples were measured. The relation of the emission brightness to the applied voltage is shown in the graph of FIG. 14.

Figure 14:
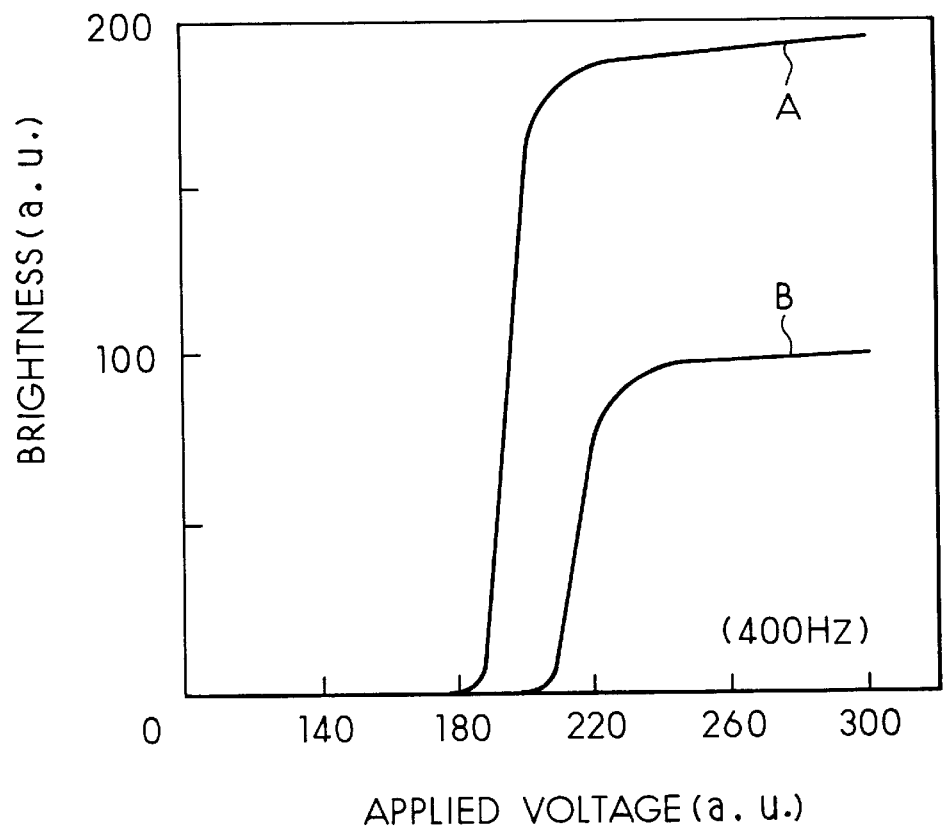
FIG. 14 is a graph showing the emission brightness-applied voltage characteristics of the electroluminescent device fabricated according to the second example.

In FIG. 14, characteristic curve A indicates the emission brightness of electroluminescent devices fabricated by the second example of method described above against the applied voltage. Characteristic curve B indicates the emission brightness of electroluminescent devices fabricated by the prior art fabrication method against the applied voltage.

In the prior art fabrication method, a luminescent layer in the form of a thin film of calcium thiogallate ($CaGa_2S_4$) doped with cerium (Ce) is formed by sputtering techniques. After the formation of the film, it is heat-treated.

More specifically, a target made from calcium thiogallate ($CaGa_2S_4$) doped with cerium (Ce) was baked under pressure. During the formation of the film, the pressure was 4 Pa. The applied electric power was 200 W. Presputtering was done for 20 minutes, and then the film was formed. At this time, the luminescent layer was grown at a rate of 55 nm/min. The film thickness was 800 nm. The electroluminescent device using this luminescent layer was identical in structure to the device of the second example described above.

As can be seen from FIG. 14, the emission brightness of the electroluminescent devices fabricated by the above-described second example of method can be improved greatly over the emission brightness of the prior art electroluminescent devices. Furthermore, the emission threshold voltages of the novel devices can be shifted toward lower voltages. Consequently, the sensitivity can be improved. The inventors measured the amounts of luminescent centers contained in the luminescent layers. The percentage of the luminescent centers in the electroluminescent devices fabricated by the second example of method was 0.5 atomic percent. The emission brightnesses of electroluminescent devices fabricated with modified percentages of luminescent centers were measured. The inventors confirmed that electroluminescent devices containing luminescent centers up to about 2 atomic percent were superior in emission brightness to the electroluminescent devices fabricated by the above-described prior art method.

Where the concentration of the luminescent center is less than 0.1 atomic percent, its measurement results vary greatly because of problems with the analyzing instrument. The inventors consider, however, that if the lower limit of the concentration of the luminescent center is established, then emission brightnesses superior to the emission brightnesses of electroluminescent devices fabricated by the prior art method will be obtained up to about 0.01 atomic percent.

In this way, an electroluminescent device emitting blue light of higher brightness than the prior art device can be fabricated by the second example of method.

In the fabrication machine according to the second example already described in connection with FIG. 12, the above-described gaseous source materials are introduced from immediately under the glass substrate 11. The gases are expelled from the rear surface of the substrate 11 to control the pressure. Therefore, the introduced gaseous source materials are uniformly supplied onto the surface of the glass substrate 11 on which films are to be formed. Furthermore, flow of these source materials inside the reaction furnace 20 can be controlled with greater ease.

Furthermore, in the fabrication machine shown in FIG. 12, the gaseous source materials belonging to groups II, IIIB, and VIB, respectively, are independently introduced into the reaction furnace 20 via the mass flow controllers 54, 55, and 56, respectively. In consequence, the supply of the gases of the elements composing the luminescent layer can be controlled precisely. Also, it is relatively easy to match it to the stoichiometric ratio. In practice, the source material supply tubes in which the mass flow controllers are respectively installed are provided with gas flow control lines as shown in FIG. 3 as mentioned previously.

In this second example, the cerium (Ce) added as a luminescent center is expected to be replaced with gallium (Ga), which has the same valence number (three) as cerium and is a constituent of the luminescent layer. Therefore, the cerium source material is mixed with the IIIB-group element source material via the gas supply tube 32 and then the mixture is supplied into the reaction furnace 20.

Figure 15:
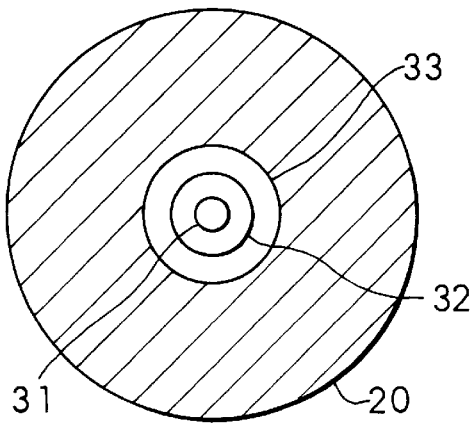
FIG. 15 is a schematic plan view of a gaseous source material supply pipe used in a machine according to the second example of the invention.

Accordingly, the fabrication machine needs the same number of source material containers or tanks as the constituent elements. However, only three gas supply tube systems are required to supply the gaseous source materials of these elements into the reaction furnace 20. However, these gaseous source material supply tubes are arranged inside the reaction furnace 20 in such a way that the gaseous source materials of the elements do not react with each other in gas phase inside the reaction furnace 20 and that the gases can be uniformly supplied into the whole surface of the substrate on which films are to be formed as shown in FIG. 15.

More specifically, the gas supply tube 31 for supplying bisdipivaloylmethanate calcium ($Ca(C_{11}H_{19}O_2)_2$) which is a source material of calcium (Ca) is laid in the center. The gas supply tube 32 for supplying both triethyl gallium (Ga ($C_2H_5)_3$) that is the source material of gallium (Ga) and tridipivaloylmethanate cerium ($Ce(C_{11}H_{19}O_2)_3$) which is the source material of the luminescent center is laid around the tube 31. The diethyl sulfur ($S(C_2H_5)_2$) which is used as a source material of the sulfur (S) is introduced through the gas supply tube 33 located under the reaction furnace 20 so that an excessive amount of diethyl sulfur can stay inside the furnace 20. Thus, the supply of the diethyl sulfur ($S(C_2H_5)_2$) will not greatly impede the flow of the source materials, i.e., calcium and gallium.

Figure 16:
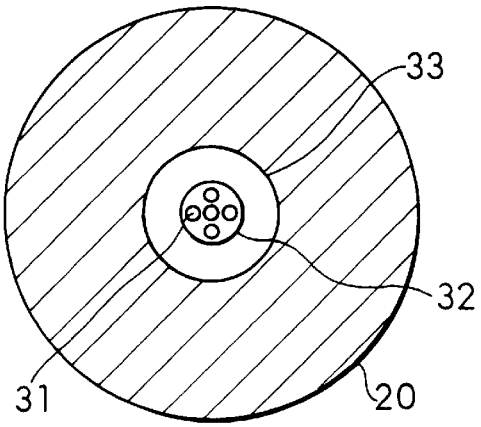
FIG. 16 is a schematic plan view of another gaseous source material supply pipe used in the machine according to the second example.

It is to be understood that the arrangement of these gaseous source material supply tubes is not limited to the above-described scheme. For example, as shown in FIG. 16, a plurality of gas supply tubes 31 for supplying the bisdipivaloylmethanate calcium ($Ca(C_{11}H_{19}O_2)_3$) which is the source material of calcium (Ca) may be laid inside the gas supply tube 32 for supplying both triethyl gallium (Ga($C_2H_5)_3$) that is the source material of gallium (Ga) and tridipivaloylmethanate cerium (Ce($C_{11}H_{19}O_2)_3$) that is the source material of the luminescent center. In this case, a luminescent layer of more uniform film composition could be obtained.

Figure 17:
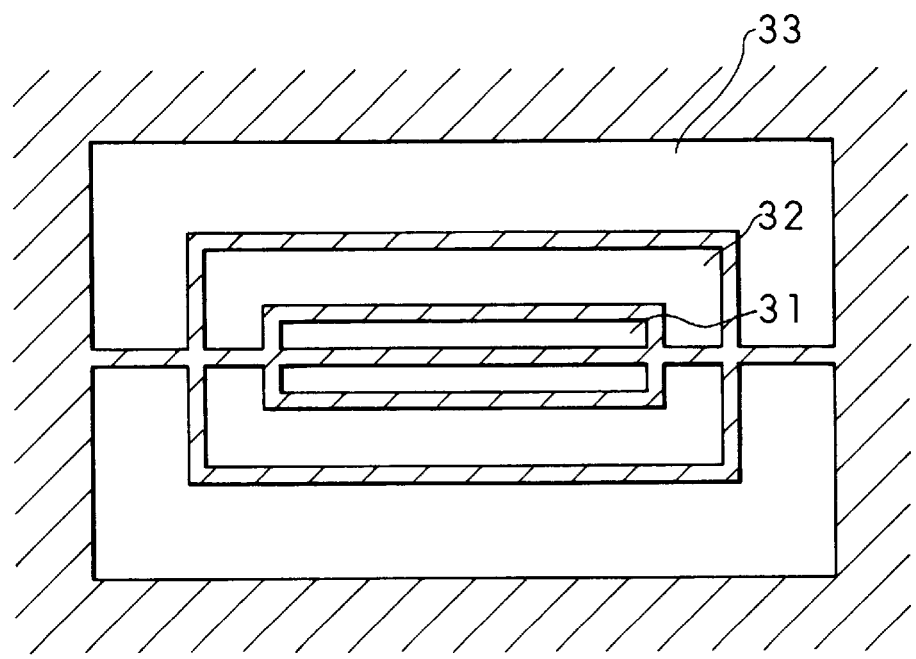
FIG. 17 is a schematic plan view of a further gaseous source material supply pipe used in the machine according to the second example.
Figure 18:
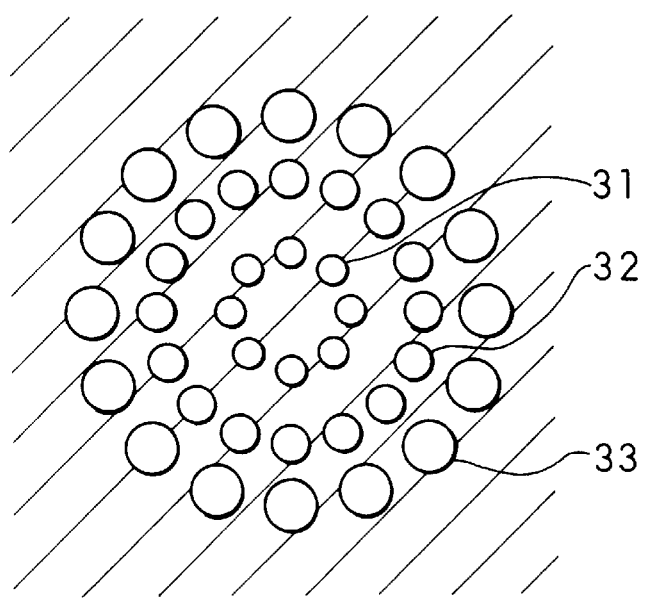
FIG. 18 is a schematic plan view of a yet other gaseous source material supply pipe used in the machine according to the second example.

Moreover, these gaseous source material supply tubes can be arranged and shaped as shown in FIGS. 17 and 18. With respect to the gas supply tube 31 for the bisdipivaloylmethanate calcium (Ca($C_{11}H_{19}O_2)_2$) and the gas supply tube 32 for the triethyl gallium (Ga($C_2H_5)_3$) and the tridipivaloylmethanate cerium (Ce($C_{11}H_{19}O_2)_3$), each supply tube can have a rectangular blowout port or have a plurality of blowout ports. Similarly, the gas supply tube 33 for the diethyl sulfur (S($C_2H_5)_2$) can have a rectangular blowout port around the gas supply tubes 31 and 32 or have a plurality of blowout ports.

In the machine according to the second example illustrated in connection with FIG. 12, since the cerium (Ce) added as a luminescent center is expected to be replaced with gallium (Ga), which has the same valence number (three) as cerium and is a constituent of the luminescent layer. Therefore, the cerium source material is mixed with the IIIB-group element source material via the gas supply tube 32 and then the mixture is supplied into the reaction furnace 20. However, the sublimation temperature is as high as 145° C. as described above when using tridipivaloylmethanate cerium (Ce($C_{11}H_{19}O_2)_3$) as a luminescent center source material.

Figure 19:
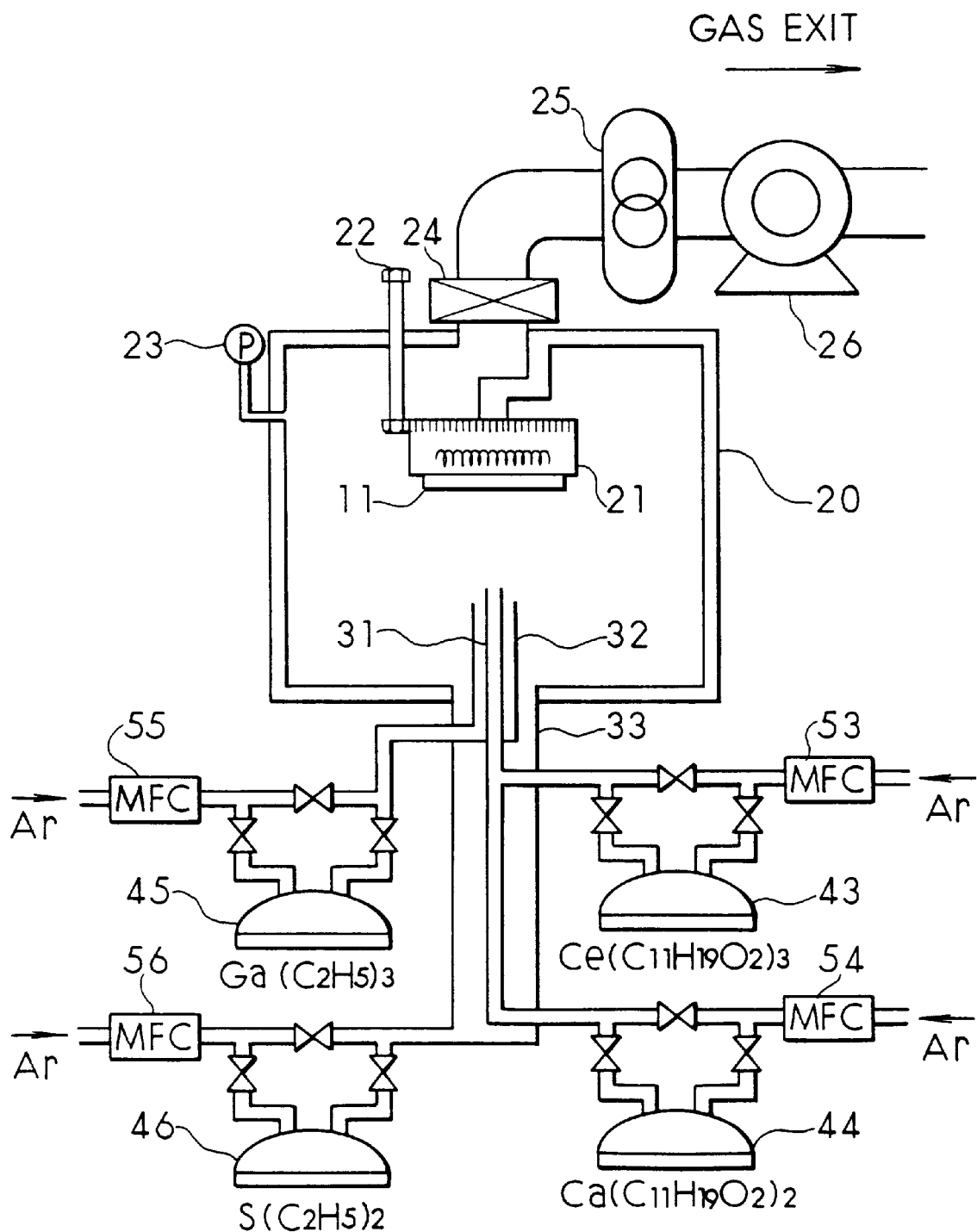
FIG. 19 is a schematic diagram of another machine for fabricating an electroluminescent device, the machine being built according to the second example.

Alternatively, as shown in FIG. 19, the gas supply tube 31 for supplying the II-group element gaseous source material such as the bisdipivaloylmethanate calcium (Ca($C_{11}H_{19}O_2)_2$) having a high vaporization temperature can also act as the gas supply tube for the luminescent center source material. In this tubular arrangement, decomposition and resolidification can be well prevented.

In a case where manganese (Mn) is added as a luminescent center, the gas supply tube 31 for supplying calcium (Ca) which is a component of the luminescent layer and having the same valence number (two) as manganese can also be used. This promotes exchange between manganese and calcium. The structure of the fabrication machine used in this case is shown in FIG. 20.

Figure 20:
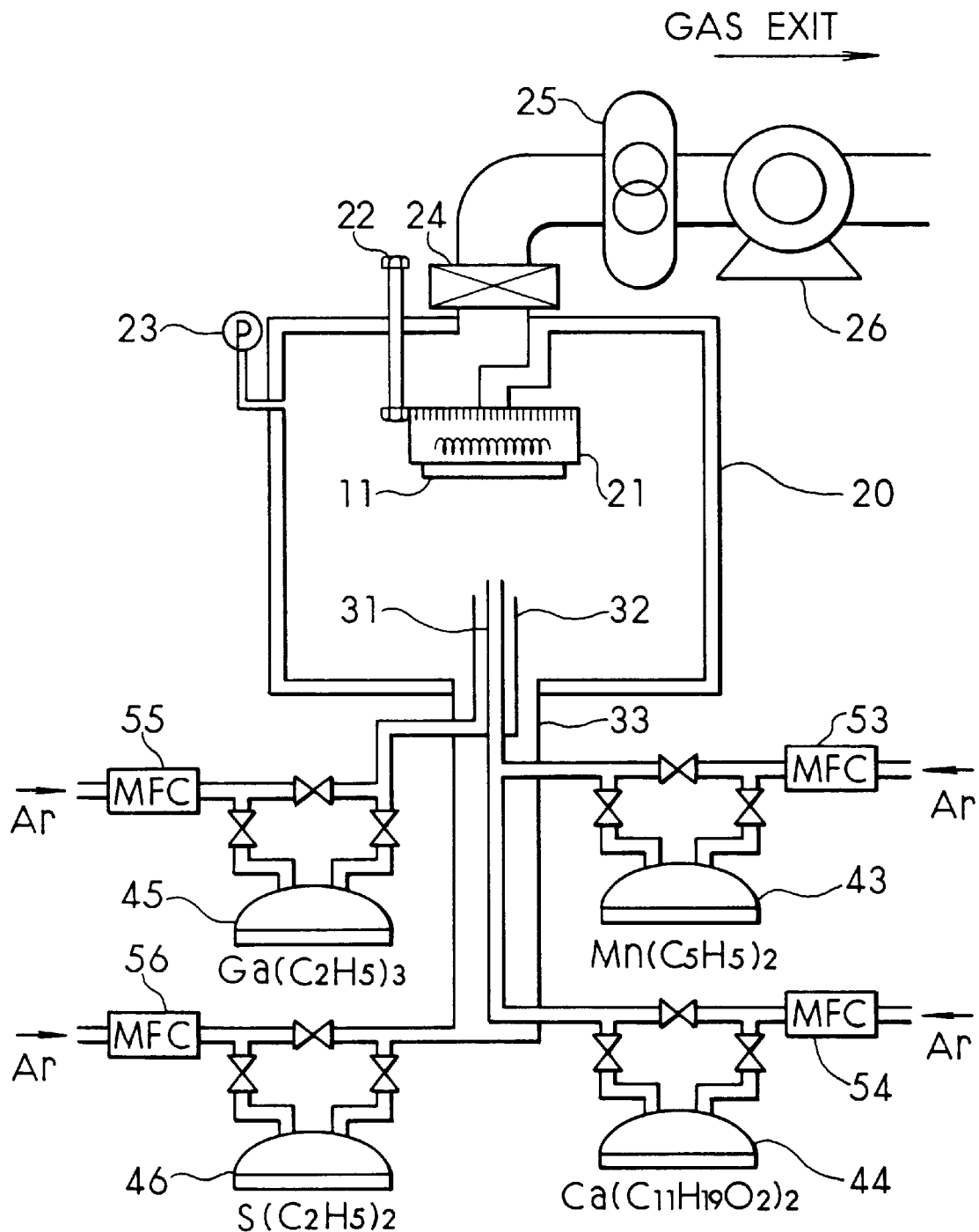
FIG. 20 is a schematic diagram of a machine according to the second example, the machine using other source materials.

In the example shown in FIG. 20, biscyclopentadienyl manganese (Mn($C_5H_5)_2$) is used as a source material of the manganese (Mn). This is a solid and has a high sublimation temperature and so it can share the gas supply tube 31 with calcium source material without difficulty.

Tricarbonyl methyl cyclopentadienyl manganese (TCM) or other material may also be used as a source material of the manganese. For these source materials of low vaporization temperatures, the system can be designed so that the gas supply tube 32 for a IIIB-group element gaseous source material can be used in common.

In the above-described second example, diethyl sulfur (S($C_2H_5)_2$) is used as a VIB-group element source material. Hydrogen sulfide ($H_2S$) diluted with gaseous argon (Ar) can also be employed as a VIB-group element source material. It is also possible to form a layer of calcium thiogallate (CaGa$_2$S$_4$) doped with cerium (Ce) by introducing this hydrogen sulfide ($H_2S$) into the reaction furnace 20. Obviously, even if hydrogen sulfide ($H_2S$) is used as a VIB-group element source material, the flow rate of the supplied source material is in excess of its stoichiometric ratio.

In a case where hydrogen sulfide ($H_2S$) is used as a VIB-group element source material, the hydrogen sulfide and argon are introduced into the reaction furnace 20 while adjusting the total flow rate to 250 cc/min by a mass flow controller (MFC). More specifically, the flow rate of the hydrogen sulfide ($H_2S$) is controlled to 10 cc/min. The flow rate of the argon, with which the hydrogen sulfide is diluted, is controlled to 240 cc/min. In the same manner as in the case of diethyl sulfur (S($C_2H_5)_2$), these gaseous source materials are supplied onto the surface of the glass substrate 11 (strictly, the first dielectric layer 13) through the gas supply tube 33. The rate at which gas is blown out of this gas supply tube 33 is 2 mm/sec in the same way as the foregoing.

Figure 21:
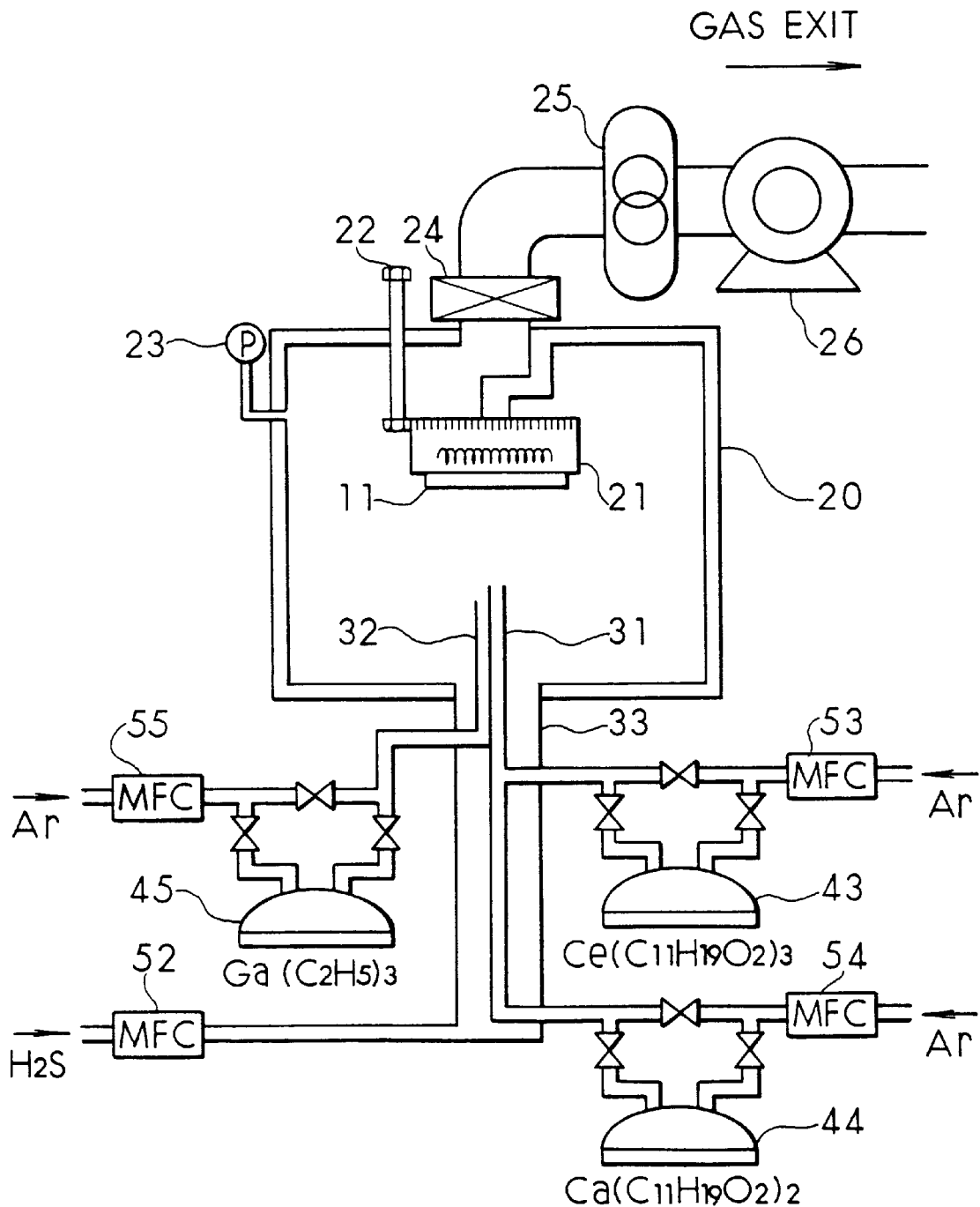
FIG. 21 is a schematic diagram of a further machine according to the second example.

The instrumentation shown in FIG. 21 can also be utilized to add a luminescent center in cases including the case in which hydrogen sulfide ($H_2S$) is used as a VIB-group element source material. In particular, in this instrumentation shown in FIG. 21, the gaseous source material forming the luminescent center is supplied onto the surface of the glass substrate 11 (strictly, the first dielectric layer 13) through the gas supply tube 31 which is also used for bisdipivaloylmethanate calcium (Ca($C_{11}H_{19}O_2)_2$) which is a II-group element source material. In this instrumentation shown in FIG. 19, however, the gas supply tube 32 for supplying the IIIB-group element gaseous source material does not surround this gas supply tube 31. The gases are introduced into the reaction furnace 20 through the gas supply tubes 31 and 32 which are adjacent to each other.

Figure 22:
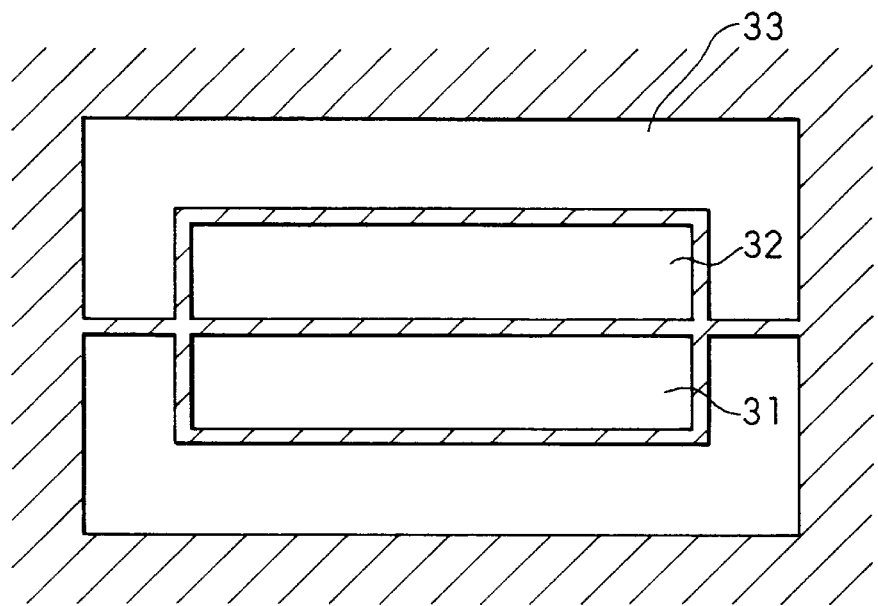
FIG. 22 is a schematic plan view of a gaseous source material supply pipe used in the machine shown in FIG. 21.

Accordingly, in this case, the arrangement of the source material gas supply tubes and their shapes are relatively simple. As shown in FIG. 22, the gas supply tube 33 for supplying the VIB-group gaseous source material is laid around the adjacent gas supply tubes 31 and 32. In this way, the aforementioned CVD machine is realized. The inventors have experimentally confirmed that the aforementioned electroluminescent device emitting blue light can be fabricated with this simple structure.

As mentioned above, this fabrication machine needs only three gas supply tube systems. Of course, the same number of gas supply tubes as constituent elements can be prepared in the same way as the source material containers or tanks. In this case, however, the tubes can be designed similarly to the above-described tubing.

Figure 23:
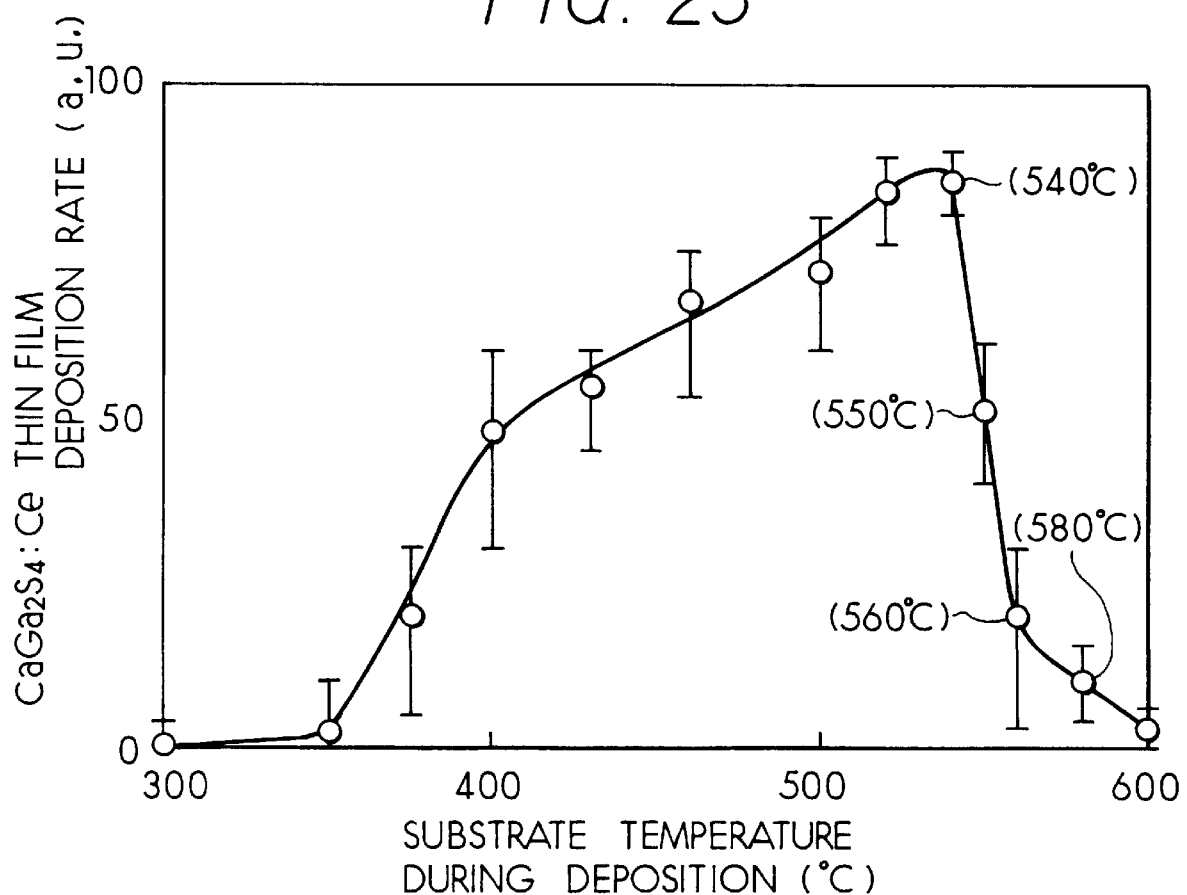
FIG. 23 is a graph showing the relationship of the rate at which a thin film of calcium thiogallate is deposited to the temperature at which the substrate is heated when the film is formed.

In the second example described above, the glass substrate 11 is heated and maintained at a constant temperature of 540° C. Experiments were conducted to know the relation of the rate at which a film of calcium thiogallate (CaGa$_2$S$_4$) doped with cerium (Ce) to the temperature to which the substrate 11 is heated. The results are shown in FIG. 23.

In a case where the glass substrate 11 was heated to temperatures lower than 300° C., the crystals of luminescent layers of the above-described calcium thiogallate (CaGa$_2$S$_4$) were not grown rapidly. Only rough thin films were obtained.

Similarly, in the range of 300 to 400° C., growth of thin films progressed but electroluminescent devices using such luminescent layers produced no practical blue light emission brightness.

The upper limit of temperatures at which the glass substrate 11 is treated is 600° C. If this upper limit is exceeded, the substrate 11 is distorted. That is, this temperature of 600° C. is a critical temperature in using the glass substrate 11.

In the range of 560 to 600° C., decomposition of sulfur, or source material, is promoted. Luminescent layers containing an excessive amount of sulfur, i.e., deviating from the stoichiometric ratio, are formed. Of course, the luminescent characteristics are deteriorated. Therefore, the temperature to which the glass substrate 11 is heated to form a high-quality luminescent layer is limited to the range of 300 to 600° C. Preferably, this range is 400 to 560° C.

Even in the fabrication machine according to the second example shown in FIG. 12, the glass substrate 11 on which the luminescent layer is to be formed is fixedly mounted to the susceptor 21 equipped with a heater. During the formation of the layer, the substrate temperature is controlled by providing feedback control utilizing a thermocouple.

It is to be noted that the substrate temperatures so far described indicates the temperature set into the fabrication machine. The inventors consider that the actual substrate temperature is lowered by about 100 to 200° C. owing to the blowing of the gaseous source materials. The relation of the rate at which a thin film of a luminescent layer is formed to the temperature to which the substrate 11 is heated is roughly common to every example including examples described later.

Figure 24:
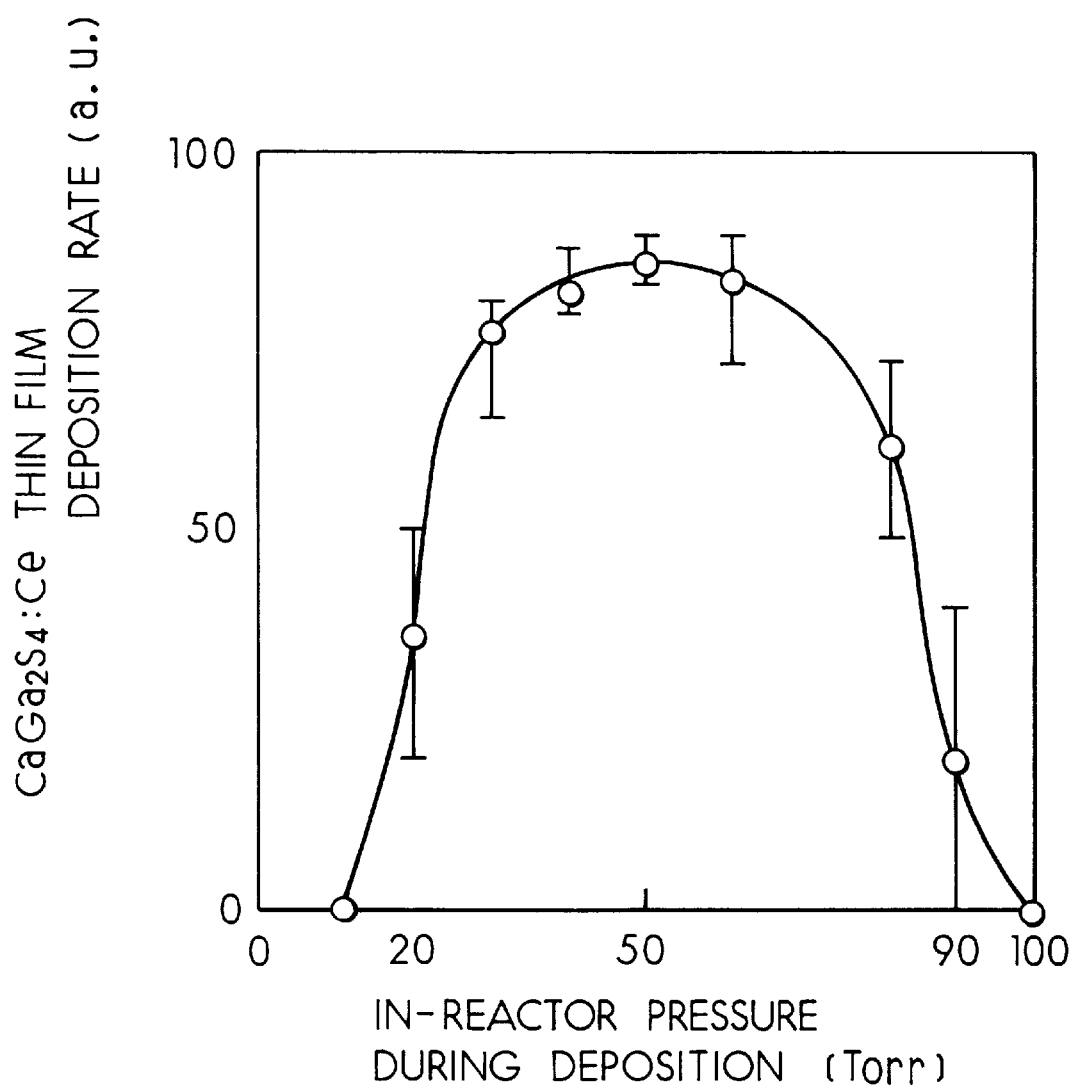
FIG. 24 is a graph showing the relationship of the rate at which a thin film of calcium thiogallate is deposited to the pressure inside the reaction furnace when the film is formed.

In the second example, the flow rate of expelled gas is controlled in such a way that the inside of the reaction furnace 20 is reduced down to a subatmospheric pressure of 50 torr. Experiments have revealed that the range of pressures at which a thin film of calcium thiogallate ($CaGa_2S_4$) can be formed was 20 to 90 torr, as shown in FIG. 24. However, where the pressure was 90 torr, this thin film sometimes could not be formed. For this reason, the range of pressures adapted for formation of this thin film is 20 to 80 torr. Where a thin film is formed at a relatively high rate, it is desired to control the pressure range to 30–70 torr. The relation of the rate at which a thin film of a luminescent layer is formed to the pressure inside the reaction furnace 20 is roughly common to every example including examples described later.

Furthermore, in the fabrication machine according to the second example shown in FIG. 12, the source material containers or tanks 43–46 can be arranged at will.

Figure 25:
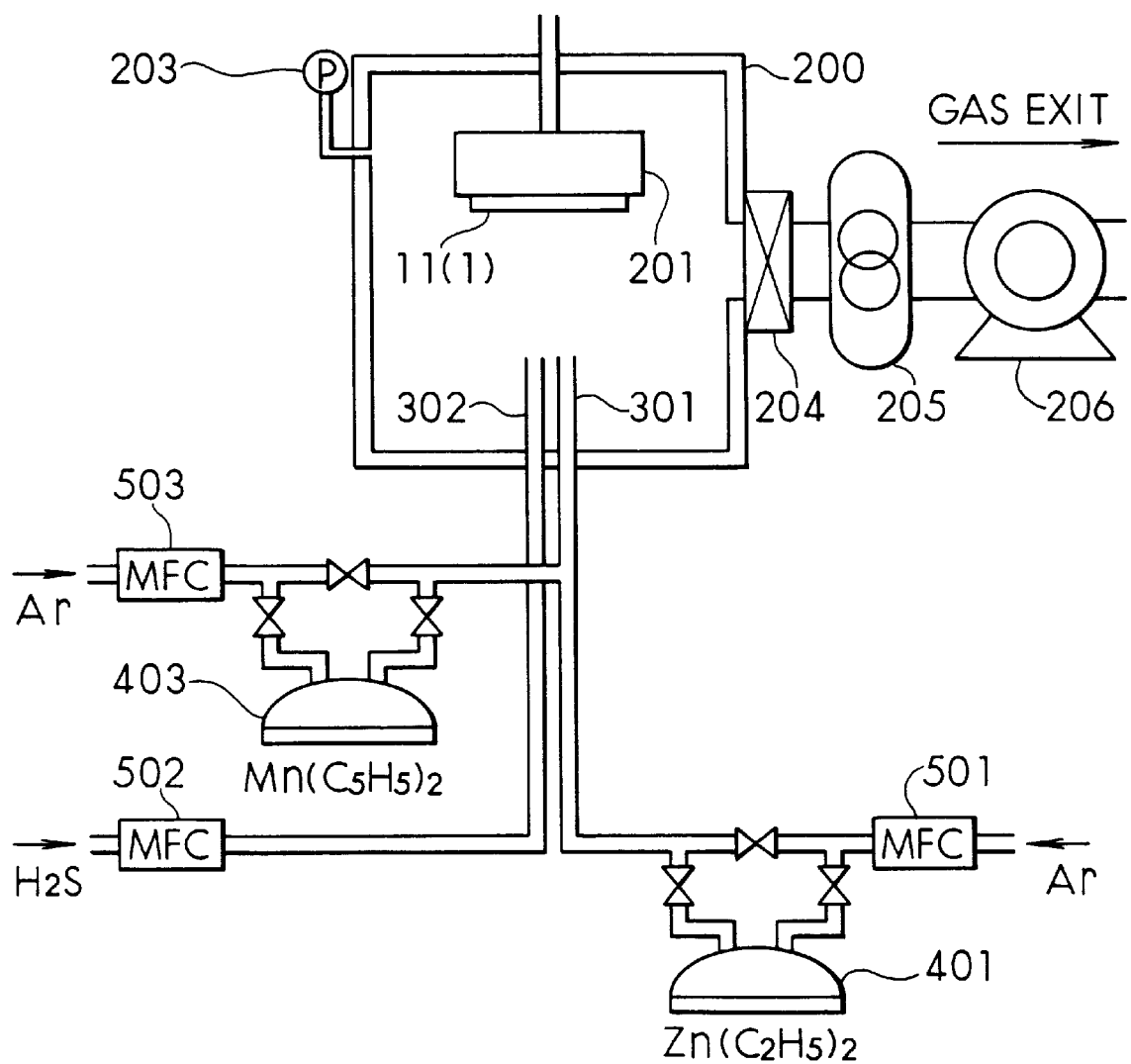
FIG. 25 is a schematic diagram of the conventional MOCVD machine for fabricating an electroluminescent device.

For reference, the structure of a conventioally used MOCVD machine for formation of luminescent layers of electroluminescent devices is shown in FIG. 25. In this prior art MOCVD machine, only zinc sulfide (ZnS) to which dicyclo-pentadienylmanganese ($Mn(C_5H_5)_2$) is added as a luminescent center could be formed, the zinc sulfide being a compound synthesized from diethylzinc ($Zn(C_2H_5)_2$) and hydrogen sulfide ($H_2S$).

In this prior art machine, gaseous source materials supplied into the reaction furnace 200 tend to be attracted toward the exhaust side because the exhaust port is located beside the reaction furnace 200. Therefore, if a supply tube for a IIIB-group element source material gas is added to this machine, the distribution of the film composition will vary, depending on the film formation conditions.

However, in the MOCVD machine according to the second example shown in FIG. 12, uniform luminescent layers of a ternary compound which deviate only a little from the desired composition can be deposited even by chemical vapor deposition. In the prior art techniques, it has been impossible to obtain such layers by chemical vapor deposition.

The prior art MOCVD machine shown in FIG. 25 has a susceptor 201, a pressure gauge 203, a gate valve 204, a mechanical booster pump 205, a rotary pump 206, gas supply tubes 301, 302, source material containers or tanks 401, 403, and mass flow controllers (MFCs) 501–503.

Also in the above-described second example, cerium (Ce) is used to obtain an electroluminescent device emitting blue light. Europium (Eu), manganese (Mn), or terbium (Tb) may also be used as luminescent centers. Of course, where these source materials are used, it is necessary to use other source material containers or tanks for loading a compound of the luminescent center element.

Moreover, it is possible to add some of these source materials simultaneously as luminescent centers. Also in this case, white light emission is provided by controlling the amounts of the added source materials. Blue light is obtained by passing this white light through a filter or filters.

THIRD EXAMPLE

A third example of the present invention is next described. An electroluminescent device fabricated according to this third example is similar in cross-sectional structure to the structure already described in connection with FIG. 1 except that selenium (Se) is used as a component of the luminescent layer 14 instead of sulfur (S) used in the second example. A layer of calcium digallium tetraselenide ($CaGa_2Se_4$) to which cerium (Ce) is added as a luminescent center is formed.

A thin-film electroluminescent device 100 according to the third example is fabricated in the manner described now. A first transparent electrode layer 12 is formed on a glass substrate 11 and a first dielectric layer 13 is formed out of tantalum pentoxide ($Ta_2O_5$) on the electrode layer 12, in the same way as in the first and second examples.

Figure 26:
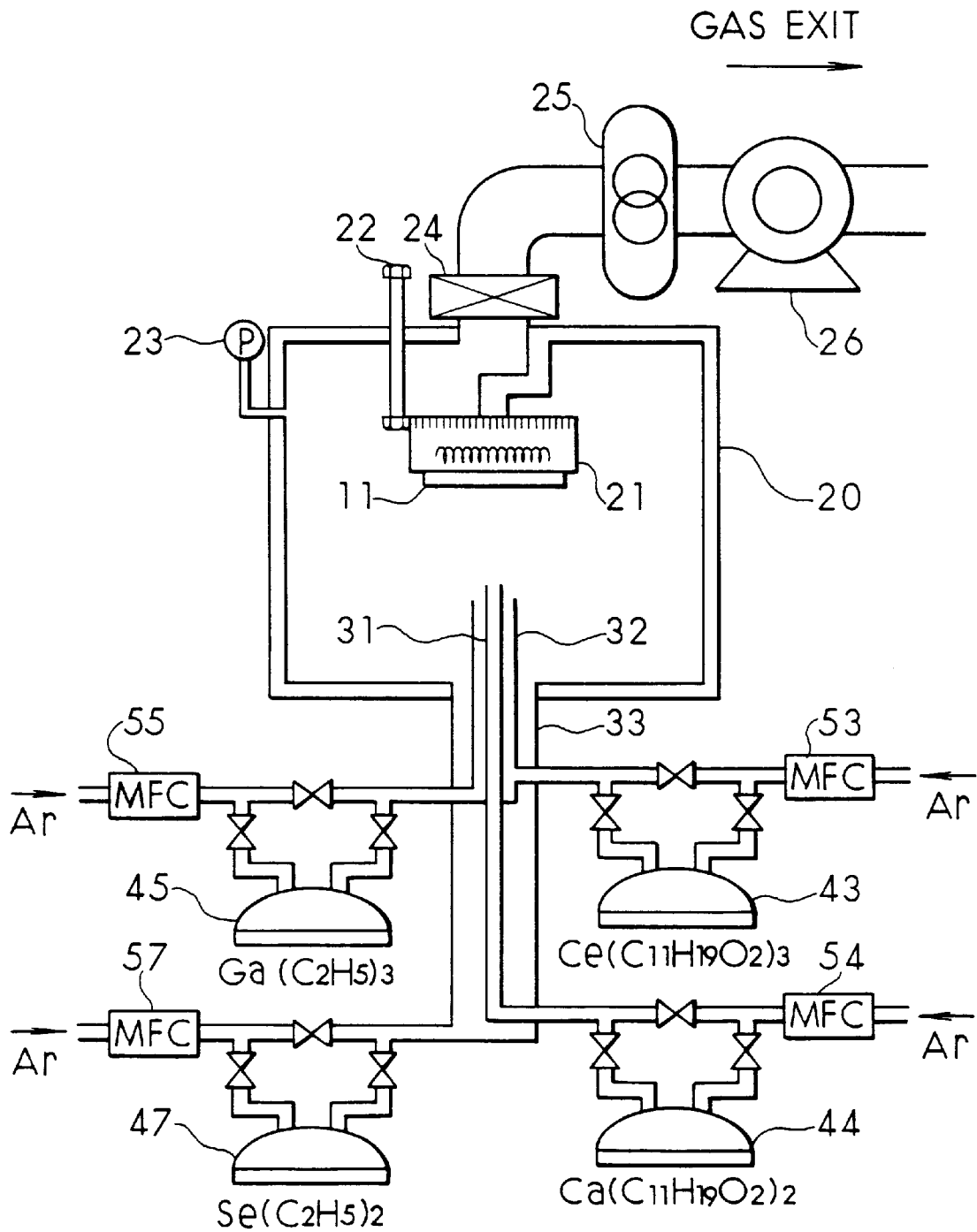
FIG. 26 is a schematic diagram of a machine for fabricating an electroluminescent device, the machine being built according to a third example of the invention.

A luminescent layer 14 of calcium digallium tetraselenide ($CaGa_2Se_4$) to which cerium (Ce) is added as a luminescent center is formed on the first dielectric layer 13 by the MOCVD machine shown in FIG. 26. This MOCVD machine shown in FIG. 26 has the same components as used in the MOCVD machines shown in FIGS. 2 and 12, and these like components are indicated by like reference numerals. In this third example, the following operations are carried out:

(a) The glass substrate 11 on which the first transparent electrode layer 12 and the first dielectric layer 13 have been formed is mounted to the susceptor 21 capable of rotating inside the reaction furnace 20. The rotational frequency of the susceptor can be controlled. The susceptor 21 is rotated at 5 rpm via the rotation control rod 22.

(b) The glass substrate 11 is maintained at a constant temperature of 540° C. via the susceptor 21.

(c) The flow rate of expelled gas is controlled by the pressure regulator (not shown) down to a subatmospheric pressure of 50 torr while monitoring the pressure inside the reaction furnace 20 with the pressure gauge 23.

(d) The gas is expelled through the gate valve 24, the mechanical booster pump 25, and the rotary pump 26.

Then, as a II-group element gaseous source material, bisdipivaloylmethanate calcium ($Ca(C_{11}H_{19}O_2)_2$) is introduced along with a carrier gas of argon (Ar) into the reaction furnace 20. As a IIIB-group element gaseous source material, triethyl gallium ($Ga(C_2H_5)_3$) is introduced, together with a carrier gas of argon (Ar). As a VIB-group element gaseous source material, diethyl selenium (Se ($C_2H_5)_2$) is introduced, together with a carrier gas of argon. As a gaseous source material forming a luminescent center, tridipivaloylmethanate cerium ($Ce(C_{11}H_{19}O_2)_3$) is introduced, along with a carrier gas of argon. In this way, a thin film 14 of calcium digallium tetraselenide ($CaGa_2Se_4$) doped with cerium (Ce) is formed.

The above-described calcium (Ca), gallium (Ga), and cerium (Ce) acting as luminescent centers are supplied in the same manner as in the method of the above-described second example.

The selenium (Se) is supplied in the manner described below. As the source material of this selenium, diethyl selenium ($Se(C_2H_5)_2$) is used, loaded into a liquid source material container or tank 47, and kept warmed at 52° C. This vaporized source material is introduced into the reaction furnace 20 by the use of a carrier of argon (Ar) whose flow rate is controlled to 100 cc/min by a mass flow controller 57. This gaseous source material is supplied onto the surface of the glass substrate 11 (strictly, the first dielectric layer 13) through the gas supply tube 33. At this time, the rate at which gas is blown out of this gas supply tube 33 is 2 mm/sec.

A thin film of calcium digallium tetraselenide ($CaGa_2Se_4$) to which cerium (Ce) is added as a luminescent center is grown by the method described above. After the formation of this luminescent layer 14, a second dielectric layer 15 is formed out of tantalum pentoxide ($Ta_2O_5$) on the luminescent layer 14 by the same process as used to form the first dielectric layer 13, in the same way as in the first and second examples. A second transparent electrode layer 16 is formed out of zinc oxide (ZnO) on the second dielectric layer 15 by the same method as used to form the first transparent electrode layer 12.

Electroluminescent devices were actually fabricated by these fabrication methods, and their emission characteristics were measured. For reference, FIG. 27 shows CIE chromaticity coordinates based on the three-color representation method proposed by the CIE.

Figure 27:
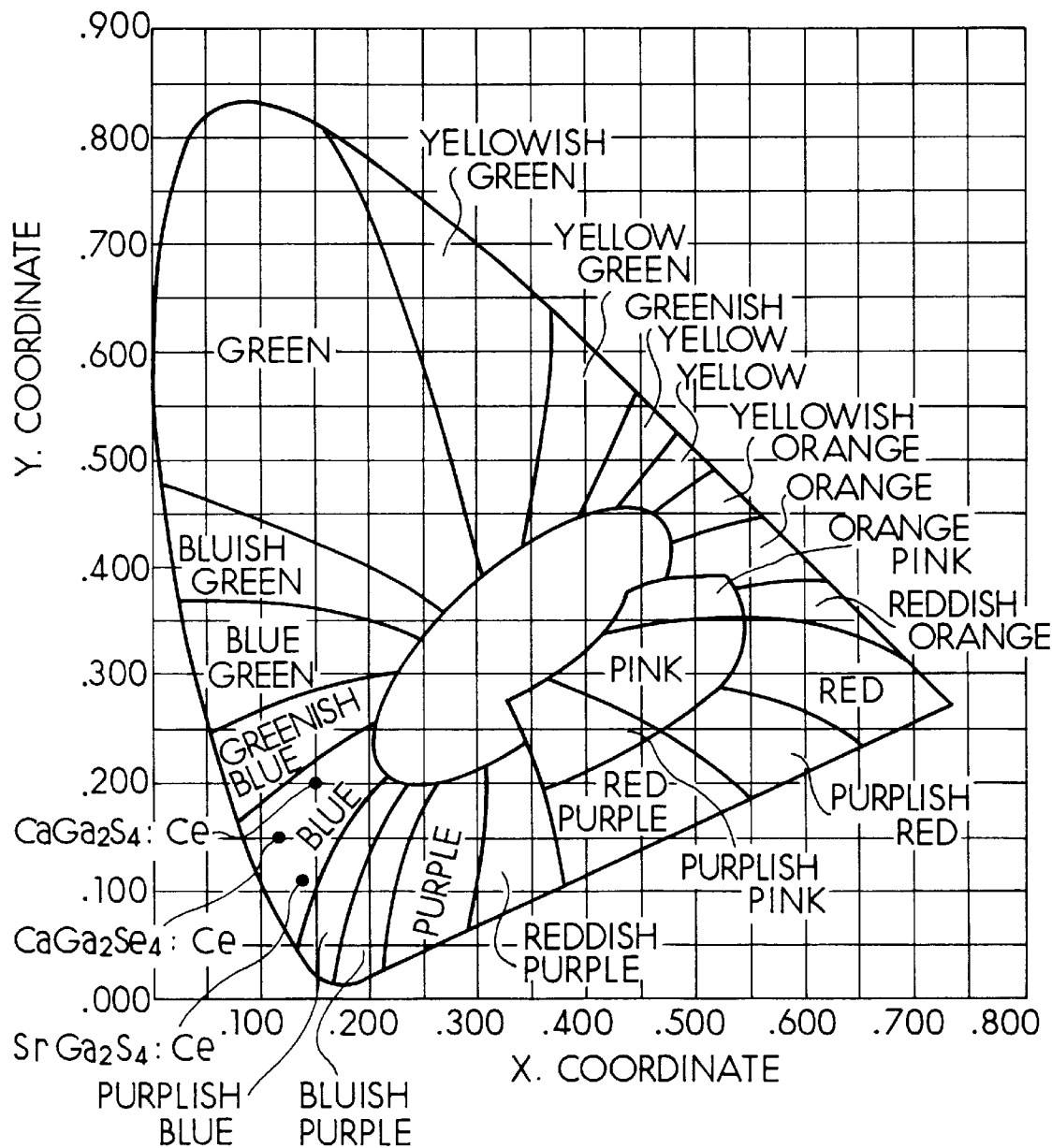
FIG. 27 is a graph showing CIE chromaticity coordinates.

In the case of electroluminescent devices using a luminescent layer fabricated by the method according to the second example described above, i.e., calcium thiogallate ($CaGa_2S_4$) to which cerium (Ce) is added as a luminescent center, the chromaticity on the CIE chromaticity diagram of FIG. 27 is given by $$(X, Y) = (0.15, 0.20)$$

On the other hand, in the case of electroluminescent devices using a luminescent layer fabricated by the method according to the present third example, i.e., calcium digallium tetraselenide ($CaGa_2Se_4$) to which cerium (Ce) is added as a luminescent center, the chromaticity on the CIE chromaticity diagram of FIG. 27 is given by $$(X, Y) = (0.12, 0.15)$$

Thus, deeper blue light is obtained.

In the third example described above, diethyl selenium ($Se(C_2H_5)_2$) is used as a VIB-group element source material. Hydrogen selenide ($H_2Se$) diluted with argon (Ar) gas can also be used as a VIB-group element source material. It has been experimentally confirmed that a film can be formed out of calcium digallium tetraselenide ($CaGa_2Se_4$) to which cerium (Ce) is added, by introducing the hydrogen selenide ($H_2Se$) into the reaction furnace 20.

Where hydrogen selenide ($H_2Se$) is used as a VIB-group element source material, the hydrogen selenide and argon are introduced into the reaction furnace 20 while adjusting the total flow rate to 250 cc/min by their respective mass flow controllers (MFCs). More specifically, the flow rate of the hydrogen selenide ($H_2Se$) is controlled to 10 cc/min. The flow rate of the argon, with which the hydrogen selenide is diluted, is controlled to 240 cc/min. These gaseous source materials are also supplied onto the surface of the glass substrate 11 (strictly, the first dielectric layer 13) through the gas supply tube 33. The rate at which gas is blown out of this gas supply tube 33 is 2 mm/sec in the same manner as in the process described above.

Figure 28:
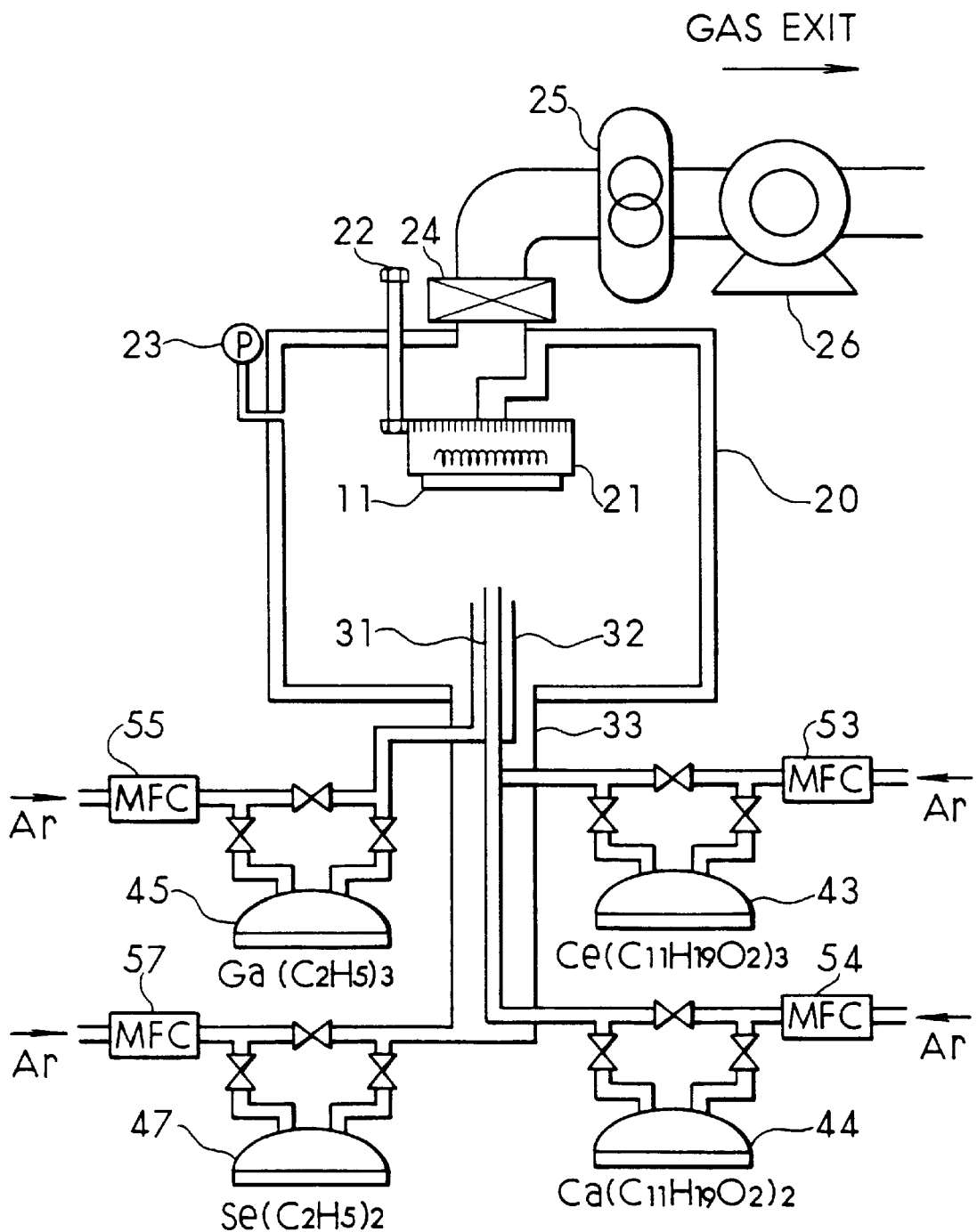
FIG. 28 is a schematic diagram of another machine for fabricating an electroluminescent device, the machine being built according to the third example.

The above-described third example can also exploit the instrumentation shown in FIG. 28 to add a luminescent center element. In particular, in this instrumentation shown in FIG. 28, the gaseous source material forming the luminescent center is supplied onto the surface of the glass substrate 11 (strictly, the first dielectric layer 13) through the gas supply tube 31 which is also used for bisdipivaloylmethanate calcium ($Ca(C_{11}H_{19}O_2)_2$) which is a II-group element source material. Electroluminescent devices having characteristics similar to those of electroluminescent devices fabricated by the machine and method of the above-described third example can be fabricated.

FOURTH EXAMPLE

A fourth example of the present example is next described. An electroluminescent device fabricated according to this fourth example is similar in cross-sectional structure to the structure already described in connection with FIG. 1 except that strontium (Sr) is used as a component of the luminescent layer 14 instead of calcium (Ca) used in the second example. A layer of strontium thiogallate ($SrGa_2S_4$) to which cerium (Ce) is added as a luminescent center is formed.

A thin-film electroluminescent device 100 according to the fourth example is fabricated in the manner described now. A first transparent electrode layer 12 is formed on a glass substrate 11 and a first dielectric layer 13 is formed out of tantalum pentoxide ($Ta_2O_5$) on the electrode layer 12, in the same way as in the first through third examples.

Figure 29:
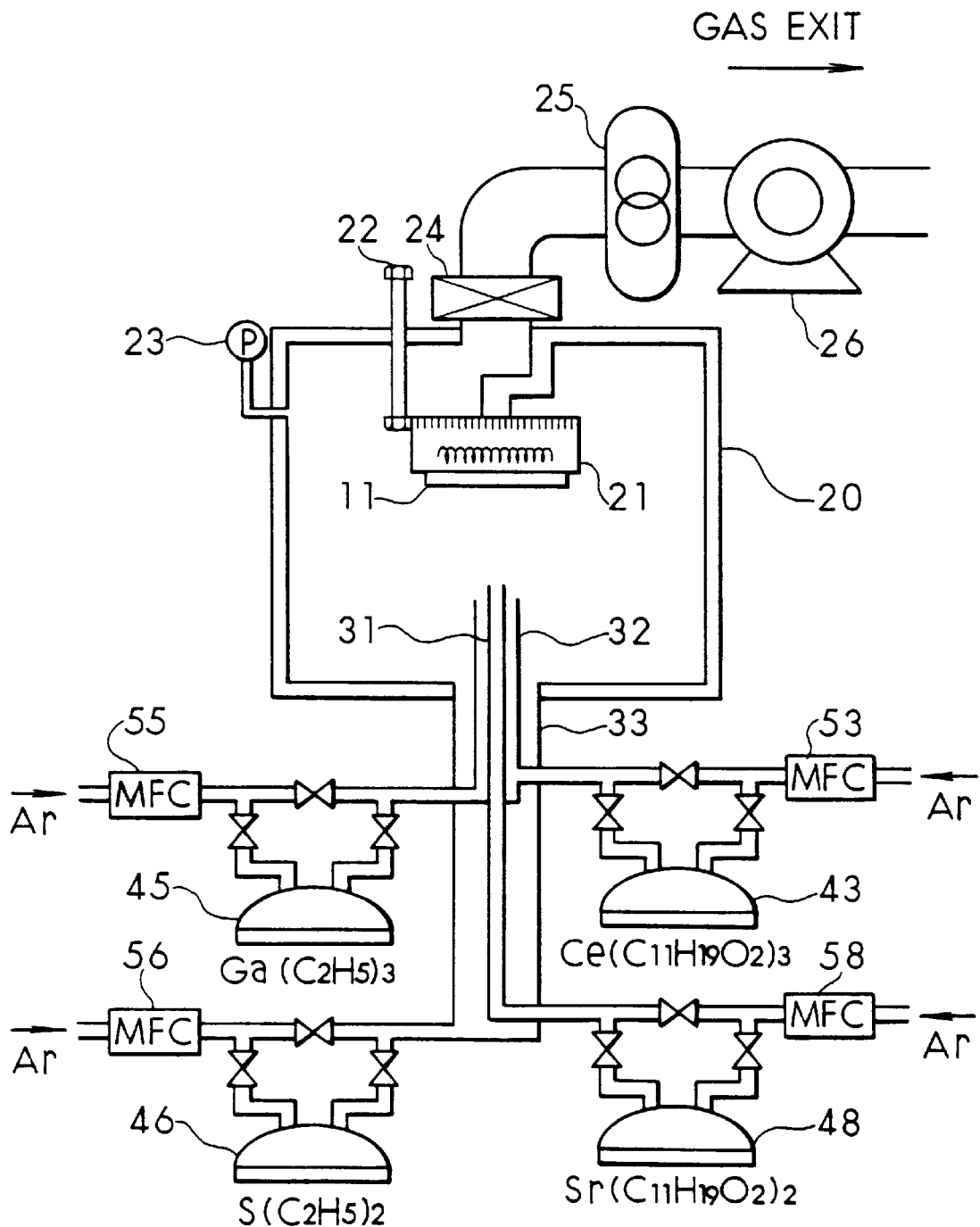
FIG. 29 is a schematic diagram of a machine for fabricating an electroluminescent device, the machine being built according to a fourth example of the invention.

A luminescent layer 14 of strontium thiogallate ($SrGa_2S_4$) doped with cerium (Ce) as a luminescent center is formed on the first dielectric layer 13 by the MOCVD machine shown in FIG. 29. This MOCVD machine shown in FIG. 29 has the same components as used in the MOCVD machines shown in FIGS. 2, 12, and 26, and these like components are indicated by like reference numerals. Also in this fourth example, the following operations are carried out:

(a) The glass substrate 11 on which the first transparent electrode layer 12 and the first dielectric layer 13 have been formed is mounted to the susceptor 21 capable of rotating inside the reaction furnace 20. The rotational frequency of the susceptor 21 can be controlled. The susceptor 21 is rotated at 5 rpm via the rotation control rod 22.

(b) The glass substrate 11 is maintained at a constant temperature 540° C. via the susceptor 21.

(c) The flow rate of expelled gas is controlled by the pressure regulator (not shown) down to a subatmospheric pressure of 50 torr while monitoring the pressure inside the reaction furnace 20 with the pressure gauge 23.

(d) The gas is expelled through the gate valve 24, the mechanical booster pump 25, and the rotary pump 26.

Then, as a II-group element gaseous source material, bisdipivaloylmethanate strontium ($Sr(C_{11}H_{19}O_2)_2$) is introduced along with a carrier gas of argon (Ar) into the reaction furnace 20. As a IIIB-group element gaseous source material, triethyl gallium ($Ga(C_2H_5)_3$) is introduced together with a carrier gas of argon (Ar). As a VIB-group element gaseous source material, diethyl sulfur ($S(C_2H_5)_2$) is introduced, together with a carrier gas of argon. As a gaseous source material forming a luminescent center, tridipivaloylmethanate cerium ($Ce(C_{11}H_{19}O_2)_3$) is introduced, along with a carrier gas of argon. In this way, a thin film 14 of strontium thiogallate ($SrGa_2S_4$) doped with cerium (Ce) is formed.

The above-described gallium (Ga), sulfur (S), and cerium (Ce) acting as a luminescent center are supplied in the same manner as in the method of the above-described second example.

The strontium (Sr) is supplied in the manner described now. Bisdipivaloylmethanate strontium ($Sr(C_{11}H_{19}O_2)_2$) is used as the source material of the strontium. This is loaded into a solid source material container or tank 48 and kept warmed at 230° C. This sublimated source material is transported into the reaction furnace 20, using argon (Ar) gas whose flow rate is controlled to 1,000 cc/min by a mass flow controller 58. This gaseous source material is supplied onto the surface of the glass substrate 11 (strictly, the first dielectric layer 13) through the gas supply tube 31. At this time, the rate at which the gas is blown out of the gas supply tube 31 is 330 mm/sec.

A thin film of strontium thiogallate ($SrGa_2S_4$) to which cerium (Ce) is added as a luminescent center is grown by the method described above. After the formation of this luminescent layer 14, a second dielectric layer 15 is formed out of tantalum pentoxide ($Ta_2O_5$) on the luminescent layer 14 by the same process as used to form the first dielectric layer 13, in the same way as in the first through examples. A second transparent electrode layer 16 is formed out of zinc oxide (ZnO) on the second dielectric layer 15 by the same method as used to form the first transparent electrode layer 12.

Electroluminescent devices were actually fabricated by these fabrication methods, and their emission characteristics were measured. The characteristics were compared with the electroluminescent devices fabricated according to the second and third examples. The result is that electroluminescent devices having luminescent layers of calcium thiogallate ($CaGa_2S_4$) to which cerium (Ce) is added as a luminescent center have the intensest emission brightness.

However, with respect to blue light purity on the CIE chromaticity coordinates shown in FIG. 27, electroluminescent devices having luminescent layers of strontium thiogallate ($SrGa_2S_4$) to which cerium (Ce) is added according to the fourth example have the highest blue purity, whose coordinates are given by (X, Y)=(0.13, 0.11)

In the fourth example described above, diethyl sulfur ($S(C_2H_5)_2$) is used as a VIB-group element source material. Hydrogen sulfide ($H_2S$) diluted with argon (Ar) can also be used as a VIB-group element source material. It has been experimentally confirmed that a film can be formed out of strontium thiogallate ($SrGa_2S_4$) to which cerium (Ce) is added, by introducing the hydrogen sulfide ($H_2S$) into the reaction furnace 20.

Figure 30:
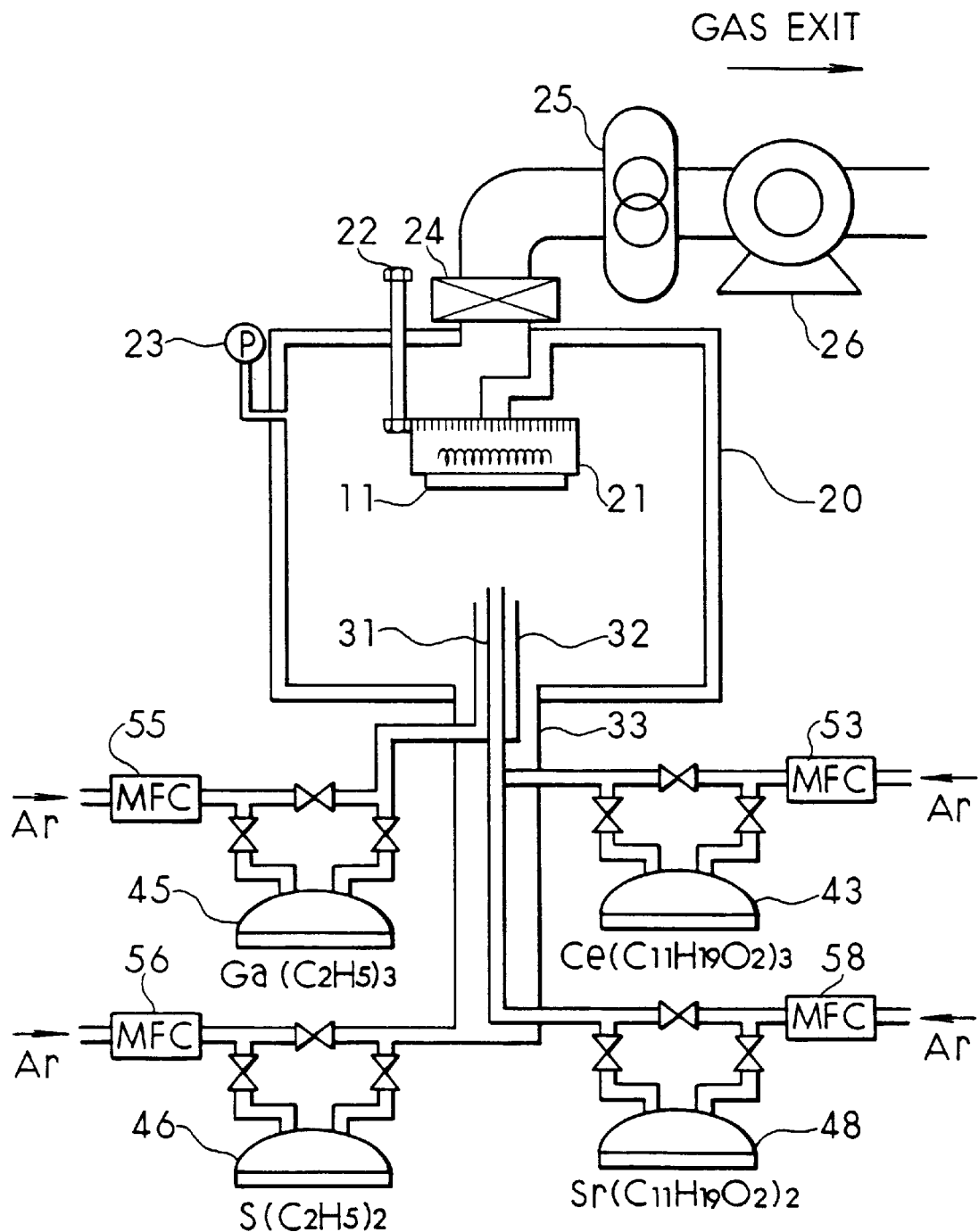
FIG. 30 is a schematic diagram of another machine for fabricating an electroluminescent device, the machine being built according to the fourth example.

The above-described fourth example can also exploit the instrumentation shown in FIG. 30 to add a luminescent center element. In particular, in this instrumentation shown in FIG. 30, tridipivaloylmethanate cerium ($Ce(C_{11}H_{19}O_2)_3$) which is the gaseous source material forming the luminescent center is supplied onto the surface of the glass substrate 11 (strictly, the first dielectric layer 13) through the gas supply tube 31 which is also used for bisdipivaloylmethanate strontium ($Sr(C_{11}H_{19}O_2)_2$) which is a II-group element source material. Electroluminescent devices having characteristics similar to those of electroluminescent devices fabricated by the machine and method of the fourth example.

FIFTH EXAMPLE

A fifth example of the present example is next described. An electroluminescent device fabricated according to this fifth example is similar in cross-sectional structure to the structure already described in connection with FIG. 1 except that the luminescent layer 14 is formed out of calcium thiogallate ($CaGa_2S_4$) to which cerium (Ce) and chlorine (Cl) are added as luminescent centers.

A thin-film electroluminescent device 100 according to the fifth example is fabricated in the manner described now. A first transparent electrode layer 12 is formed on a glass substrate 11 and a first dielectric layer 13 is formed out of tantalum pentoxide ($Ta_2O_5$) on the electrode layer 12, in the same way as in the first through fourth examples.

Figure 31:
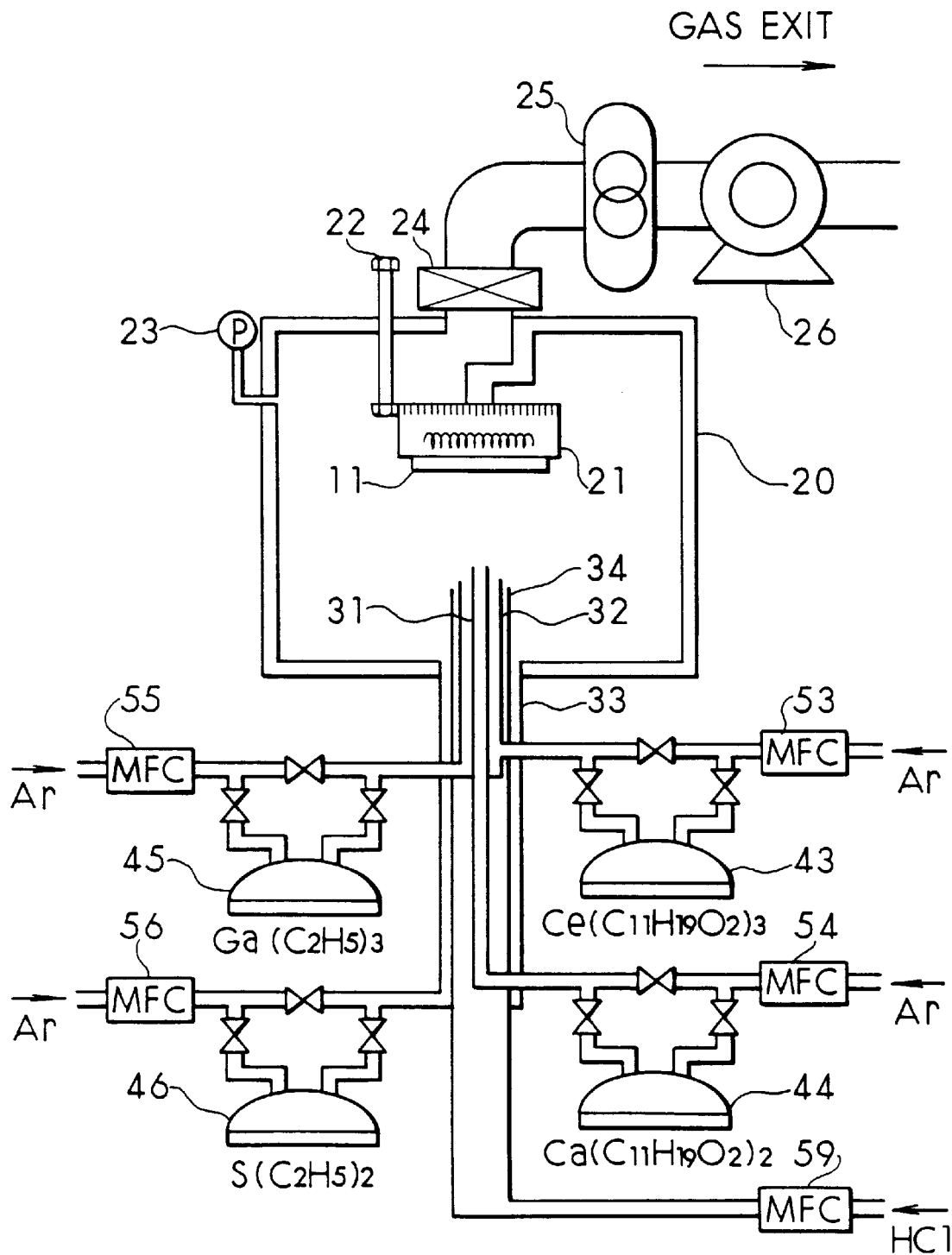
FIG. 31 is a schematic diagram of a machine for fabricating an electroluminescent device, the machine being built according to a fifth example of the invention.

A luminescent layer of calcium thiogallate ($CaGa_2S_4$) doped with cerium (Ce) as luminescent center and with chlorine (Cl) is formed on the first dielectric layer 13 by the MOCVD machine shown in FIG. 31. This MOCVD machine shown in FIG. 31 has the same components as used in the MOCVD machines shown in FIGS. 2, 12, 26, and 29, and these like components are indicated by like reference numerals. In this fifth example, the following operations are carried out:

(a) The glass substrate 11 on which the first transparent electrode layer 12 and the first dielectric layer 13 have been formed is mounted to the susceptor 21 capable of rotating inside the reaction furnace 20. The rotational frequency of the susceptor can be controlled. The susceptor 21 is rotated at 5 rpm via the rotation control rod 22.

(b) The glass substrate 11 is maintained at a constant temperature of 540° C. via the susceptor 21.

(c) The flow rate of expelled gas is controlled by the pressure regulator (not shown) down to a subatmospheric pressure of 50 torr while monitoring the pressure inside the reaction furnace 20 with the pressure gauge 23.

(d) The gas is expelled through the gate valve 24, the mechanical booster pump 25, and the rotary pump 26.

Then, as a II-group element gaseous source material, bisdipivaloylmethanate calcium ($Ca(C_{11}H_{19}O_2)_2$) is introduced along with a carrier gas of argon (Ar) into the reaction furnace 20. As a IIIB-group element gaseous source material, triethyl gallium ($Ga(C_2H_5)_3$) is introduced, together with a carrier gas of argon (Ar). As a VIB-group element gaseous source material, diethyl sulfur ($S(C_2H_5)_2$) is introduced, together with a carrier gas of argon. As a gaseous source material forming a luminescent center, tridipivaloylmethanate cerium ($Ce(C_{11}H_{19}O_2)_3$) is introduced, along with a carrier gas of argon. Furthermore, as a source material of halogen element, hydrogen chloride (HCl) is introduced. In this way, a thin film 14 of calcium thiogallate ($CaGa_2S_4$) doped with cerium (Ce) and chlorine (Cl) is formed.

The above-described calcium (Ca), gallium (Ga), sulfur (S), and cerium (Ce) acting as a luminescent center are supplied in the same manner as in the method of the above-described second example.

The chlorine (Cl) is supplied in the manner described now. Gaseous hydrogen chloride (HCl) diluted with argon (Ar) is used as the source material of the chlorine. This gas is introduced into the reaction furnace 20 while the flow rate is being controlled to 1 cc/min by a mass flow controller 59. This hydrogen chloride gas is supplied onto the surface of the glass substrate 11 (strictly, the first dielectric layer 13) through a gas supply tube 34 independent of other gas supply tubes. The amount of the chlorine (Cl) added to the luminescent layer can be adjusted easily by supplying the hydrogen chlorine (HCl) gas independent of the other source materials forming the film.

The gas supply tube 34 for supplying the hydrogen chloride gas is made of stainless steel which has been electrolytically polished to prevent the tube from becoming corroded. A thin film of calcium thiogallate ($CaGa_2S_4$) to which cerium (Ce) and chlorine (Cl) are added is grown by the method and machine described above. After the formation of this luminescent layer 14, a second dielectric layer 15 is formed out of tantalum pentoxide ($Ta_2O_5$) on the luminescent layer 14 by the same process as used to form the first dielectric layer 13, in the same way as in the first through fourth examples. A second transparent electrode layer 16 is formed out of zinc oxide (ZnO) on the second dielectric layer 15 by the same method as used to form the first transparent electrode layer 12.

Electroluminescent devices were actually fabricated by these fabrication methods, and their emission characteristics were measured. The result is that electroluminescent devices having luminescent layers where the ratio of the concentration of chlorine (Cl) to cerium (Ce) was 0.1 to 3 produced emission brightnesses higher than those of electroluminescent devices having luminescent layers not doped with chlorine.

The gas supply tubes 31–33 for supplying the gaseous source materials into the reaction furnace 20 are arranged similarly to the tubing shown in FIGS. 15 and 16. In particular, one or more gas supply tubes 31 for supplying a gaseous source material of a group II element are laid in the center. The gas supply tube or tubes 32 for supplying a gaseous source material of a group IIIB element are laid around the supply tubes 31. The gas supply tube or tubes 33 for supplying a gaseous source material of a VIB-group element are laid around the tubes 32.

A gas supply tube 34 for a halogen element is laid between the gas supply tubes 32 for the group IIIB element and the gas supply tube or tubes 33 for the gaseous source material of a VIB-group element, as shown in FIG. 31.

The inventors discussed various positions for arrangement of the gas supply tube 34 for a halogen element and conducted experiments. The electroluminescent device fabricated with the tubular arrangement described above had the highest emission efficiency.

Where the above-described MOCVD machine should be simplified, the above-described gas supply tubes 33 for the VIB-group element gas can also be used as the halogen gas supply tubes 34. In this case, the common gas supply tubes 33 must be tubes of stainless steel electrolytically polished as mentioned above.

Obviously, the method and machine (MOCVD machine) according to this fifth example can be applied to all of the first through fourth examples and to their modifications.

In all of the electroluminescent device fabrication machines or MOCVD machines according to the first through fifth examples, the gas exhaust port is located above the rear surface of the glass substrate 11 mounted to the susceptor 21. Obviously, the MOCVD machines are not limited to this structure.

Figure 32:
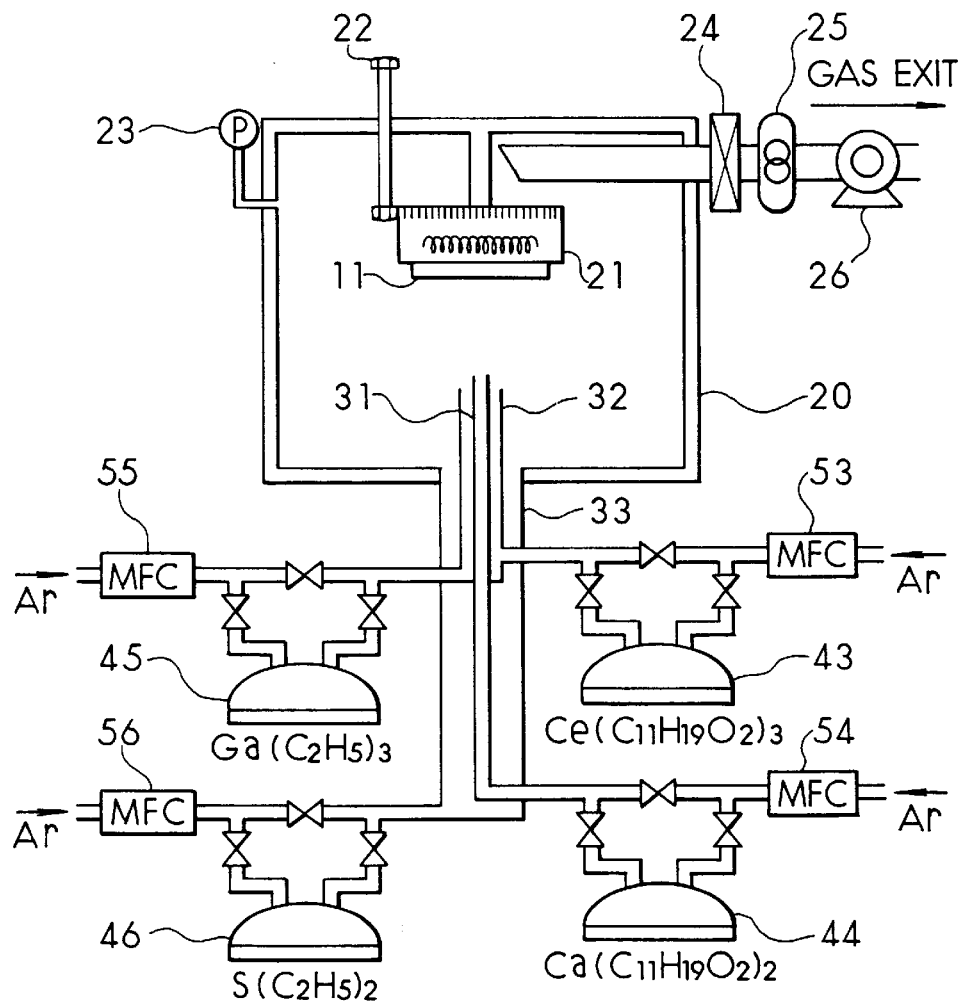
FIG. 32 is a schematic diagram of a modification of an exhaust structure that is a typical component of an electroluminescent device fabrication machine according to the second example.
Figure 33:
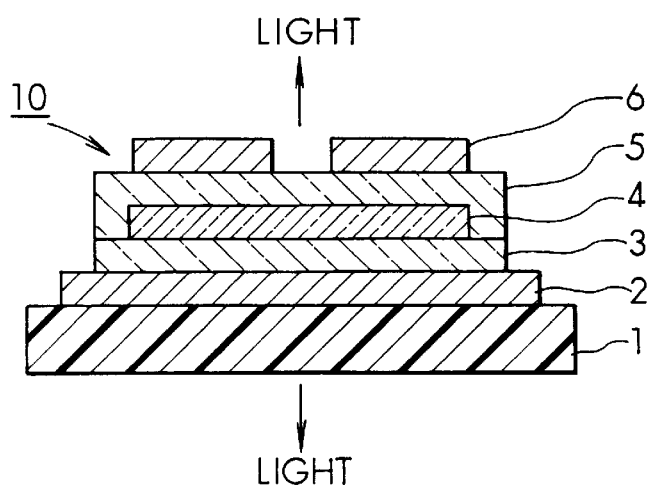
FIG. 33 is a schematic cross sectional view of an electroluminescent device fabricated by the conventional method.

The electroluminescent device fabrication machine (MOCVD machine) according to the second example shown in FIG. 12 is now taken as a typical example. As shown in FIG. 32, the gas exhaust port is located beside the rear surface of the glass substrate 11.

In summary, as long as the various source material gases are supplied from just under the front surface of the glass substrate 11 and gas is expelled from the side of the rear surface of the substrate 11, uniform supply of the gases onto the surface of the substrate is maintained. Also, flows of these gases inside the reaction furnace 20 can be retained well.

In the first through fifth examples, an organic compound such as tridipivaloylmethanate cerium ($Ce(C_{11}H_{19}O_2)_3$) is used as a source material of an element forming a luminescent center. An organic compound such as bisdipivaloylmethanate strontium ($Sr(C_{11}H_{19}O_2)_2$) or bisdipivaloylmethanate calcium ($Ca(C_{11}H_{19}O_2)_2$) is used as a source material of an element belonging to group II of the periodic table. An organic element such as triethyl gallium ($Ga(C_2H_5)_3$) is employed as a source material of an element belonging to group IIIB. Therefore, the vaporization temperatures or sublimation temperatures of these elements can be advantageously lowered. This facilitates stable film deposition along with the above-described fabrication machines. Besides these source materials of these elements, alkyl halide compounds of those elements can similarly be used. These alkyl halide compounds can also lower the evaporation or sublimation temperatures of these elements.

In the first through fifth examples, alkaline earth metals such as strontium (Sr) and calcium (Ca) are used as group II elements. Other elements belonging to group II can be similarly adopted.

In any of the first through fifth examples described above, any one of sulfur (S) or selenium (Se) is used as a group VIB constituent. A mixture of sulfur and selenium can also be used as a group VIB constituent.

In the second through fifth examples, triethyl gallium ($Ga(C_2H_5)_3$) is used as a source material of an element belonging to group IIIB. Besides, at least one of organic compounds including trimethyl gallium (TMG), trialkyl gallium, triethoxy gallium ($Ga(OEt)_3$), tridipivaloylmethanate gallium ($Ga(C_{11}H_{19}O_2)_3$), and acetylacetone gallium ($Ga(AcAc)_3$) can be used.

As described in detail thus far, according to the present invention, a high-quality luminescent layer emitting intense blue light can be formed for an electroluminescent layer, whether the luminescent layer is made of binary or ternary compound. Furthermore, according to the invention, it is not necessary to perform a heat-treatment after formation of a film acting as a luminescent layer. Hence, steps performed to fabricate an electroluminescent device can be simplified. As a result, a high-quality electroluminescent device can be fabricated more economically. In addition, the thickness of a layer of low crystallinity produced in the initial phase of a film by sputtering techniques or other techniques can be reduced greatly, and the emission threshold voltage can be shifted toward lower voltages.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of fabricating an electroluminescent device, comprising the steps of:

preparing a group II element belonging to one of group IIA and group IIB of the periodic table as a first gaseous source material, preparing a group VIB element belonging to group VIB of the periodic table as a second gaseous source material, both said group II element and said group VIB element acting as host materials of a luminescent layer, and preparing an element acting as a luminescent center as a third gaseous source material;

supplying said first gaseous source material into a reaction furnace via a first gas supply passage at a first flow rate;

supplying said second gaseous source material into said reaction furnace via a second gas supply passage different from said first gas supply passage, and at a second flow rate that is less than the first flow rate, in such a manner that a stream of said first gaseous source material is surrounded by a stream of said second gaseous source material, wherein a ratio of said first flow rate to said second flow rate is at least approximately 4;

supplying said third gaseous source material into said reaction furnace; and causing said first, second and third gaseous source materials to react with each other inside said reaction furnace, whereby said luminescent layer, which is composed of a II-VIB compound and is doped with said element acting as said luminescent center, is formed over an insulating substrate by chemical vapor deposition, wherein a distance between said first gas supply passage and said insulating substrate is shorter than a distance between said second gas supply passage and said insulating substrate.

2. The method of claim 1, wherein said third gaseous source material for said element acting as said luminescent center is introduced into said reaction furnace after being mixed with said first gaseous source material for said group II element.

3. The method of claim 1, wherein said first gaseous source material is an organic compound of said group II element, and wherein said third gaseous source material is an organic compound of said element acting as said luminescent center.

4. The method of claim 1, wherein said insulating substrate is glass and is heated to 300–600° C. during formation of said luminescent layer.

5. The method of claim 1, wherein a gaseous halogen or halide is supplied into said reaction furnace independent of said first and second gaseous source materials or after being mixed with said second gaseous source material.

6. The method of claim 1, wherein said flow rate ratio is approximately 5.6.

7. A method of fabricating an electroluminescent device, comprising the steps of:

preparing a group II element belonging to one of group IIA and group IIB of the periodic table as a first gaseous source material, preparing a group IIIB element belonging to group IIIB of the periodic table as a second gaseous source material, preparing a group VIB element belonging to group VIB of the periodic table as a third gaseous source material, and preparing a luminescent center element as a fourth gaseous source material; and supplying said first, second, third and fourth gaseous source materials into a reaction furnace in which an insulating substrate is located and causing said first, second, third and fourth gaseous source materials to react with each other inside said reaction furnace, whereby a luminescent layer, a host material of which is a II-IIIB-VIB compound of said group II, IIIB and VIB elements, doped with said luminescent center element is formed over said insulating substrate by chemical vapor deposition, wherein said first gaseous source material is introduced into said reaction furnace in a first gas supply passage, said third gaseous source material is introduced into said reaction furnace in a third gas supply passage different from said first gas supply passage, said first, second and third gaseous source materials are introduced into said reaction furnace in such a manner that streams of said first and second gaseous source materials are surrounded by a stream of said third gaseous source material, wherein at least a flow rate of said first gaseous source material for said group II element inside said reaction furnace is made greater than a flow rate of said third gaseous source material for said group VIB element inside said reaction furnace, and wherein a ratio of said flow rate of said first gaseous source material to said flow rate of said third gaseous source material is at least approximately 4, and wherein a distance between said first gas supply passage and said insulating substrate is shorter than a distance between said third gas supply passage and said insulating substrate.

8. The method of claim 7, wherein:

said first gaseous source material and said second gaseous source material are introduced into said reaction furnace in such a manner that the stream of said first gaseous source material is surrounded by the stream of said second gaseous source material.

9. The method of claim 8, wherein said fourth gaseous source material for said luminescent center element is a trivalent element and is introduced into said reaction furnace after being mixed with said second gaseous source material for said group IIIB element.

10. The method of claim 8, wherein said fourth gaseous source material for said luminescent center element is a bivalent element and is introduced into said reaction furnace after being mixed with said first gaseous source material for said group II element.

11. The method of claim 7, wherein said fourth gaseous source material for said luminescent center element is mixed with one of said first and second gaseous source materials having vaporization temperatures closer to a vaporization temperature of said fourth gaseous source material and then is introduced into said reaction furnace.

12. The method of claim 7, wherein said first gaseous source material is an organic compound of said group II element, said second gaseous source material is an organic compound of said group IIIB element, and said fourth gaseous source material is an organic compound of said luminescent center element.

13. The method of claim 7, wherein said insulating substrate is glass and is heated to 300–600° C. during formation of said luminescent layer.

14. The method of claim 7, wherein during formation of said luminescent layer, a pressure inside said reaction furnace is 20–90 torr.

15. The method of claim 7, wherein a gaseous halogen or halide is supplied into said reaction furnace independent of said first, second, and third gaseous source materials or is supplied into said reaction furnace after being mixed with said third gaseous source material for said group VIB element.

16. The method of claim 7, wherein said flow rate ratio is selected between approximately 4 to approximately 10.

17. A method of fabricating an electroluminescent device, comprising the steps of:

introducing a first gaseous source material for a group II element which belongs to one of group IIA and group IIB of the periodic table into a reaction furnace where an insulating substrate is disposed via a first gas supply passage;

introducing a second gaseous source material for a group VIB element which belongs to group VIB of the periodic table into said reaction furnace via a second gas supply passage different from said first gas supply passage, wherein said first gaseous source material and said second gaseous source material are introduced into said reaction furnace in such a manner that a flow rate of said first gaseous source material inside said reaction furnace is made greater than a flow rate of said second gaseous source material inside said reaction furnace, wherein a ratio of said flow rate of said first gaseous source material to said flow rate of said second gaseous source material is at least approximately 4;

introducing a third gaseous source material for an element which acts as a luminescent center into said reaction furnace; and causing said first, second and third gaseous source materials to react with each other inside said reaction furnace, whereby a luminescent layer, which is composed of a II-VIB compound and is doped with said element acting as said luminescent center, is formed over said insulating substrate by chemical vapor deposition, wherein a distance between said first gas supply passage and said insulating substrate is shorter than a distance between said second gas supply passage and said insulating substrate.

18. The method of claim 17, wherein said second gaseous source material is supplied into said reaction furnace in such a manner that a stream of said first gaseous source material is surrounded by a stream of said second gaseous source material.

19. The method of claim 17, wherein said first gaseous source material is an organic compound of said group II element, and wherein said third gaseous source material is an organic compound of said element acting as said luminescent center.

20. The method of claim 17, wherein said insulating substrate is glass and is heated to 300–600° C. during formation of said luminescent layer.

21. The method of claim 17, wherein said flow rate ratio is approximately 5.6.

22. A method of fabricating an electroluminescent device, comprising the steps of:

preparing a group II element belonging to one of group IIA and group IIB of the periodic table as a first gaseous source material, preparing a group IIIB element belonging to group IIIB of the periodic table as a second gaseous source material, preparing a group VIB element belonging to group VIB of the periodic table as a third gaseous source material, and preparing a luminescent center element as a fourth gaseous source material; and introducing said first, second, third and fourth gaseous source materials into a reaction furnace in which an insulating substrate is disposed and causing said first, second, third and fourth gaseous source materials to react with each other inside said reaction furnace, whereby a luminescent layer, a host material of which is a II-IIIB-VIB compound of said group II, IIB and VIB elements, doped with said luminescent center element is formed over said insulating substrate by chemical vapor deposition, wherein said first gaseous source material is introduced into said reaction furnace via a first gas supply passage, said third gaseous source material is introduced into said reaction furnace via a third gas supply passage different from said first gas supply passage, the introduction of said first and third gaseous source materials into said reaction furnace is controlled such that a flow rate of said first gaseous source material for said group II element inside said reaction furnace is made greater than a flow rate of said third gaseous source material for said group VIB element inside said reaction furnace, the introduction being controlled such that a ratio of said flow rate of said first gaseous source material to said flow rate of said third gaseous source material is at least approximately 4, and wherein a distance between said first gas supply passage and said insulating substrate is shorter than a distance between said third gas supply passage and said insulating substrate.

23. The method of claim 22, wherein said first, second and third gaseous source materials are introduced into said reaction furnace in such a manner that streams of said first and second gaseous source materials are surrounded by a stream of said third gaseous source material.

24. The method of claim 22, wherein said first gaseous source material is an organic compound of said group II element, said second gaseous source material is an organic compound of said group IIIB element, and said fourth gaseous source material is an organic compound of said luminescent center element.

25. The method of claim 22, wherein said insulating substrate is glass and is heated to 300–600° C. during formation of said luminescent layer.

26. The method of claim 22, wherein said flow rate ratio is selected between approximately 4 to approximately 10.

27. A method of fabricating an electro-luminescent device, comprising the steps of:

preparing a group II element belonging to one of groups IIA and IIB of the periodic table as a first gaseous source material, preparing a group III element belonging to one of groups IIIA and IIIB of the periodic table as a second gaseous source material, preparing a group VI element belonging to one of groups VIA and VIB of the periodic table as a third gaseous source material, and preparing a luminescent center element as a fourth gaseous source material;

supplying said first, second, third, and fourth gaseous source materials into a reaction furnace where an insulating substrate is disposed to react said first, second, third, and fourth gaseous source materials inside said reaction furnace with each other so that a luminescent layer, which is composed of a host material of a II-IIIB-VIB compound of said group II, IIIB and VIB elements, and said luminescent center element which is doped by said host material, is formed over said insulating substrate by chemical vapor deposition;

introducing said first gaseous source material into said reaction furnace via a first gas supplying passage;

introducing said second gaseous source material into said reaction furnace via a second gas supplying passage which differs from said first gas supplying passage; and introducing said third gaseous source material into said reaction furnace via a third gas supplying passage which differs from said second gas supplying passage, wherein said first gaseous source material is supplied from a center of said reaction furnace, said second gaseous source material is supplied from a periphery of said first gaseous source material into said reaction furnace, and said third gaseous source material is supplied from a periphery of said second gaseous source material into said reaction furnace, wherein a ratio of a flow velocity of said first gaseous source material to a flow velocity of said third gaseous source material is at least approximately 4, and wherein a distance between said first gas supply passage and said insulating substrate is shorter than a distance between said third gas supply passage and said insulating substrate.

28. The method of claim 27, wherein said first, second and fourth gaseous source materials are organic compounds.

29. The method of claim 27, wherein said insulating substrate is glass and is heated to 300–600° C. during forming of said luminescent layer.

30. The method of claim 27, wherein said fourth gaseous source material is mixed with one of said first gaseous source material and said second gaseous source material which have vapor temperatures similar to a vapor temperature of said fourth gaseous source material when supplied to said reaction furnace.

31. The method of claim 27, wherein said flow rate ratio is selected between approximately 4 to approximately 10.

* * * * *